US009929083B2

(12) United States Patent
Ha

(10) Patent No.: US 9,929,083 B2
(45) Date of Patent: Mar. 27, 2018

(54) SEMICONDUCTOR PACKAGES AND PACKAGE MODULES USING THE SAME

(71) Applicant: Jeong-Kyu Ha, Hwaseong-Si (KR)

(72) Inventor: Jeong-Kyu Ha, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/004,176

(22) Filed: Jan. 22, 2016

(65) Prior Publication Data
US 2016/0218065 A1 Jul. 28, 2016

(30) Foreign Application Priority Data
Jan. 23, 2015 (KR) .......................... 10-2015-0011301

(51) Int. Cl.
*H01L 23/13* (2006.01)
*H01L 23/498* (2006.01)

(52) U.S. Cl.
CPC .... *H01L 23/4985* (2013.01); *H01L 23/49866* (2013.01); *H01L 2224/16225* (2013.01); *H01L 2924/0002* (2013.01)

(58) Field of Classification Search
CPC ....... H01L 23/4985; H01L 2224/16225; H01L 2924/0002; H01L 2924/00; H01L 23/49866
USPC .......................................................... 257/773
See application file for complete search history.

(56) References Cited

U.S. PATENT DOCUMENTS

| 6,664,942 | B1 * | 12/2003 | Kim ..................... G02F 1/13452 345/204 |
| 6,927,344 | B1 | 8/2005 | Gall et al. |
| 7,348,492 | B1 | 3/2008 | Kawai et al. |
| 7,701,722 | B2 | 4/2010 | Hagiwara |
| 7,746,439 | B2 | 6/2010 | Kohno |
| 7,812,913 | B2 | 10/2010 | Oohira |
| 2005/0040504 | A1 * | 2/2005 | Kang .................. G02F 1/13452 257/678 |
| 2008/0144295 | A1 | 6/2008 | Wang et al. |
| 2010/0032191 | A1 | 2/2010 | Lo et al. |
| 2010/0073620 | A1 * | 3/2010 | Yamaguchi ....... G02F 1/133305 349/160 |
| 2010/0163284 | A1 * | 7/2010 | Tanahara .......... G02F 1/133351 174/255 |

(Continued)

FOREIGN PATENT DOCUMENTS

| KR | 10-0671660 B1 | 1/2007 |
| KR | 10-2014-0055607 A | 5/2014 |

*Primary Examiner* — Marcos D Pizarro
*Assistant Examiner* — Sue Tang
(74) *Attorney, Agent, or Firm* — Volentine & Whitt, PLLC

(57) ABSTRACT

A semiconductor package includes a flexible film substrate including a chip mounting region and a cut-line interposed between an inner region and an outer region of the flexible film substrate, the cut-line partially surrounding the inner region. The semiconductor package further includes first interconnection lines extending in the inner region from a first side of the chip mounting region towards an edge of the inner region of the flexible film substrate, and second interconnection lines extending in the outer region from a second side of the chip mounting region towards an edge of the outer region of the flexible film substrate. The edge of the inner region and the edge of the outer region are located on the first side of the semiconductor chip.

17 Claims, 30 Drawing Sheets

(56) References Cited

U.S. PATENT DOCUMENTS

2011/0181643 A1\* 7/2011 Yamashita ........... B41J 2/14233
347/10
2015/0060931 A1 3/2015 Jung et al.

\* cited by examiner

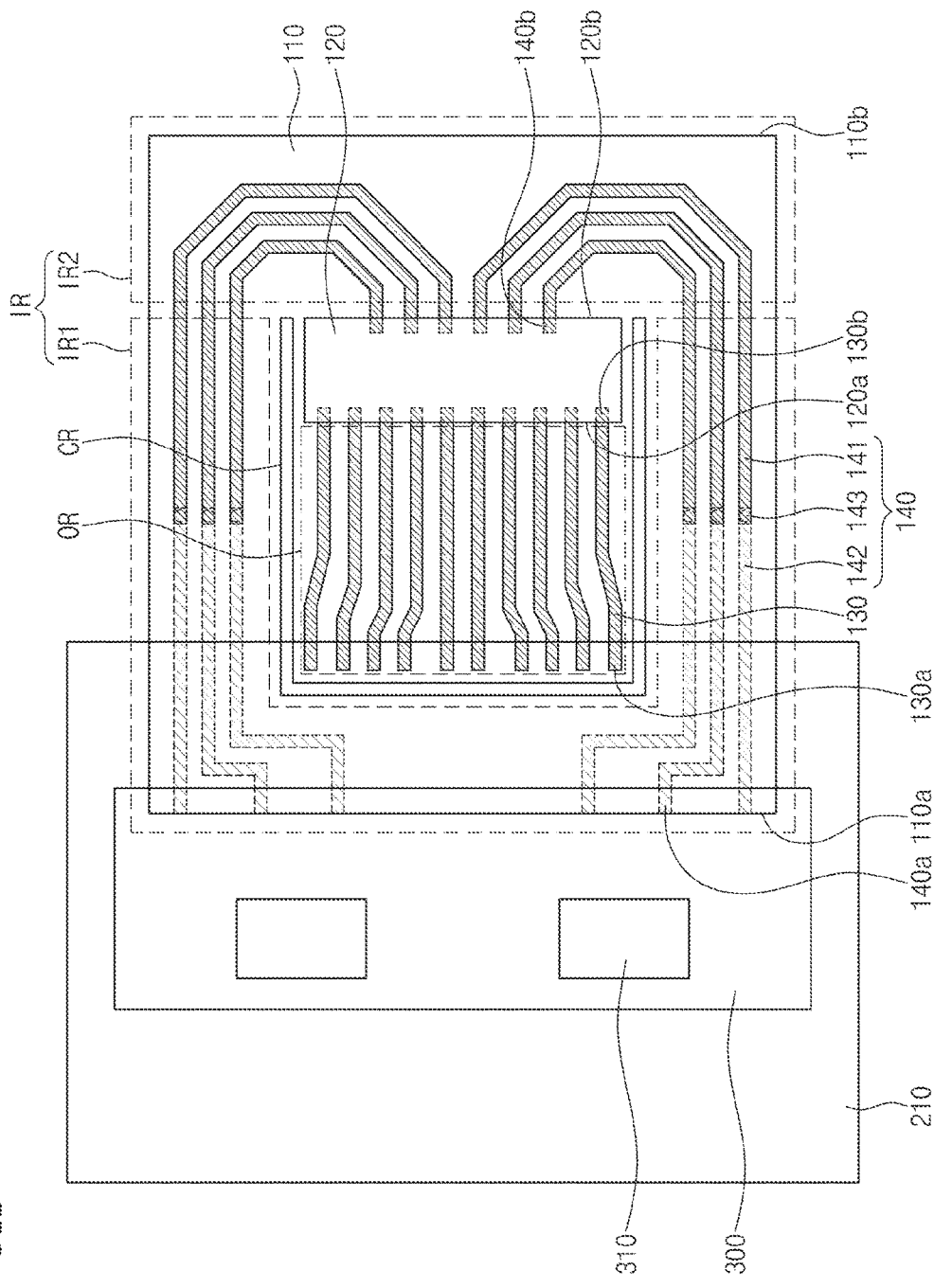

SEMICONDUCTOR PACKAGES AND PACKAGE MODULES USING THE SAME

CROSS-REFERENCE TO RELATED APPLICATION

A claim of priority under 35 U.S.C. § 119 is made to Korean Patent Application No. 10-2015-0011301, filed Jan. 23, 2015, in the Korean Intellectual Property Office, the disclosure of which is hereby incorporated by reference in its entirety.

BACKGROUND

Embodiments of the inventive concepts relate to semiconductor packages. More particularly, embodiments of the inventive concepts relate to chip-on-film (COF) packages and to package modules which include COF packages.

Chip-on-film (COF) packages are generally characterized by a substrate support formed of a flexible film. One or more semiconductor chips may be directly bonded to the flexible film substrate (e.g., by a flip-chip bonding) or may be connected to an external circuit through lead wires and the like. The use of COF is especially popular in portable devices, such as cell phones, smart phones, personal digital assistants (PDAs), laptop computers, and display devices.

SUMMARY

In an aspect of the inventive concepts, a semiconductor package is provided which includes a flexible film substrate including a chip mounting region and a cut-line interposed between an inner region and an outer region of the flexible film substrate, the cut-line partially surrounding the inner region. The semiconductor package further includes first interconnection lines extending in the inner region from a first side of the chip mounting region towards an edge of the inner region of the flexible film substrate, and second interconnection lines extending in the outer region from a second side of the chip mounting region towards an edge of the outer region of the flexible film substrate. The edge of the inner region and the edge of the outer region are located on the first side of the chip mounting region.

The chip mounting region may located directly adjacent the inner region of the flexible film substrate.

The cut-line may extend along three sides of the inner region. An intermediate of the three sides of the inner region may define the edge of the inner region and be parallel to the edge of the outer region.

The second interconnection lines wrap around the semiconductor chip so as to extend to the edge of the outer region flexible film substrate.

The flexible film substrate may be configurable between a first orientation in which the inner region is coplanar with the outer region in a side view, and a second orientation in which the inner region extends at an angle from the outer region in the side view.

The semiconductor package may further include a semiconductor chip mounted in the chip mounting region and electrically connected to the first and second interconnection lines. The semiconductor chip may be a display driver. The first interconnection lines may be output lines from the semiconductor chip, and the second interconnection lines may be input lines to the semiconductor chip. The semiconductor chip may be mounted on a same surface of the flexible film substrate as the first and second interconnection lines, or the semiconductor chip may be mounted on an opposite surface of the flexible film substrate than the first and second interconnection lines.

At least one of of first interconnection lines or the second interconnection lines may each include a first portion on one surface of the flexible film substrate, a second portion on an opposite surface of the flexible film substrate, and a substrate via connecting the first and second portions.

The flexible film substrate may further include a circuit region adjacent the edge of the outer region of the flexible film substrate, and the second interconnection lines may extend into the circuit region. The semiconductor package may further include a passive device mounted in the circuit region of the flexible film substrate, and a semiconductor chip mounted in the chip mounting region on a same surface of the flexible substrate as the passive device.

In another aspect of the inventive concepts, a chip-on-film (COF) package is provided which includes a flexible film substrate including a first surface and an opposite second surface, and a cut line passing through the flexible film substrate and horizontally separating a first region of the flexible film substrate from a second region of the flexible film substrate. The COF package further includes a chip mounting region on the first surface of the flexible film substrate, first interconnection lines extending from the chip mounting region to the first region of the flexible film substrate, and second interconnection lines extending from the chip mounting region to the second region of the flexible film substrate. A vertical position of distal ends of the first interconnection lines is movable relative to a vertical position of distal ends of the second interconnection lines by vertically displacing the first region the flexible film substrate relative to the second region of the flexible film substrate at the cut line.

The COF package may further include a semiconductor chip mounted in the chip mounting region. The semiconductor chip may be a display driver.

In still another aspect of the inventive concepts, a semiconductor module is provided which includes a chip-on-film (COF) package and an electronic device. The COF package includes a flexible film substrate including a first surface and an opposite second surface, where the flexible film substrate further includes a cut line separating a first region of the flexible film substrate from a second region of the flexible film substrate. The electronic device is connected to the COF package, and is interposed at one end between the first surface of the first region of the flexible film substrate and the second surface of the second region of the flexible film substrate, where the first and second regions are displaced relative to one another along the cut line.

The COF package may further include a display driver chip, and the electronic device may include a display device. The semiconductor module may further include a circuit substrate electrically connected to the COF package.

The second region of the flexible film substrate may at least partially surround the first region of the flexible film substrate.

The COF package may include first interconnection lines on the first surface of the first region of the flexible film substrate having distal ends connected to one side of the electronic device, and second interconnection lines having distal ends overlapping an opposite side of the electronic device. The distal ends of the second interconnection lines may be located on the first surface of the second region of the flexible film substrate, and may be electrically connected to a circuit substrate located over the first surface of the flexible film substrate. Alternatively, the distal ends of the second interconnection lines may be located on the second surface of the second region of the flexible film substrate, and may be electrically connected to a circuit substrate interposed between the opposite side of the electronic device and the second surface of the flexible film substrate.

In yet another aspect of the inventive concepts, a display apparatus is provided which includes a display device, a chip-on-film (COF) package including a display driver configured to drive the display device, and at least one circuit substrate including a timing controller configured to control the display driver, and a voltage generator configured to supply a reference voltage and a power voltage to the display driver. The COF package includes a flexible film substrate including a first surface and an opposite second surface, the flexible film substrate further including a cut line separating a first region of the flexible film substrate from a second region of the flexible film substrate. The display device is interposed at one end between the first surface of the first region of the flexible film substrate and the first surface of the second region of the flexible film substrate, wherein the first and second regions are displaced relative to one another along the cut line.

The second region of the flexible film substrate may at least partially surround the first region of the flexible film substrate.

The COF package may include first interconnection lines on the first surface of the first region of the flexible film substrate having distal ends connected to one side of the display device, and second interconnection lines having distal ends overlapping an opposite side of the display device. The distal ends of the second interconnection lines may be located on the first surface of the second region of the flexible film substrate, and may be electrically connected to the at least one circuit substrate located over the first surface of the flexible film substrate. Alternatively, the distal ends of the second interconnection lines may be located on the second surface of the second region of the flexible film substrate, and may be electrically connected to the at least one circuit substrate interposed between the opposite side of the display device and the second surface of the flexible film substrate.

BRIEF DESCRIPTION OF THE DRAWINGS

The inventive concepts will become readily apparent from the detail description that follows, with reference to the accompanying drawings, in which:

FIG. 5A is a plan view illustrating a package module according to an embodiment of the inventive concepts;

DETAILED DESCRIPTION OF THE EMBODIMENTS

Figure 1A:
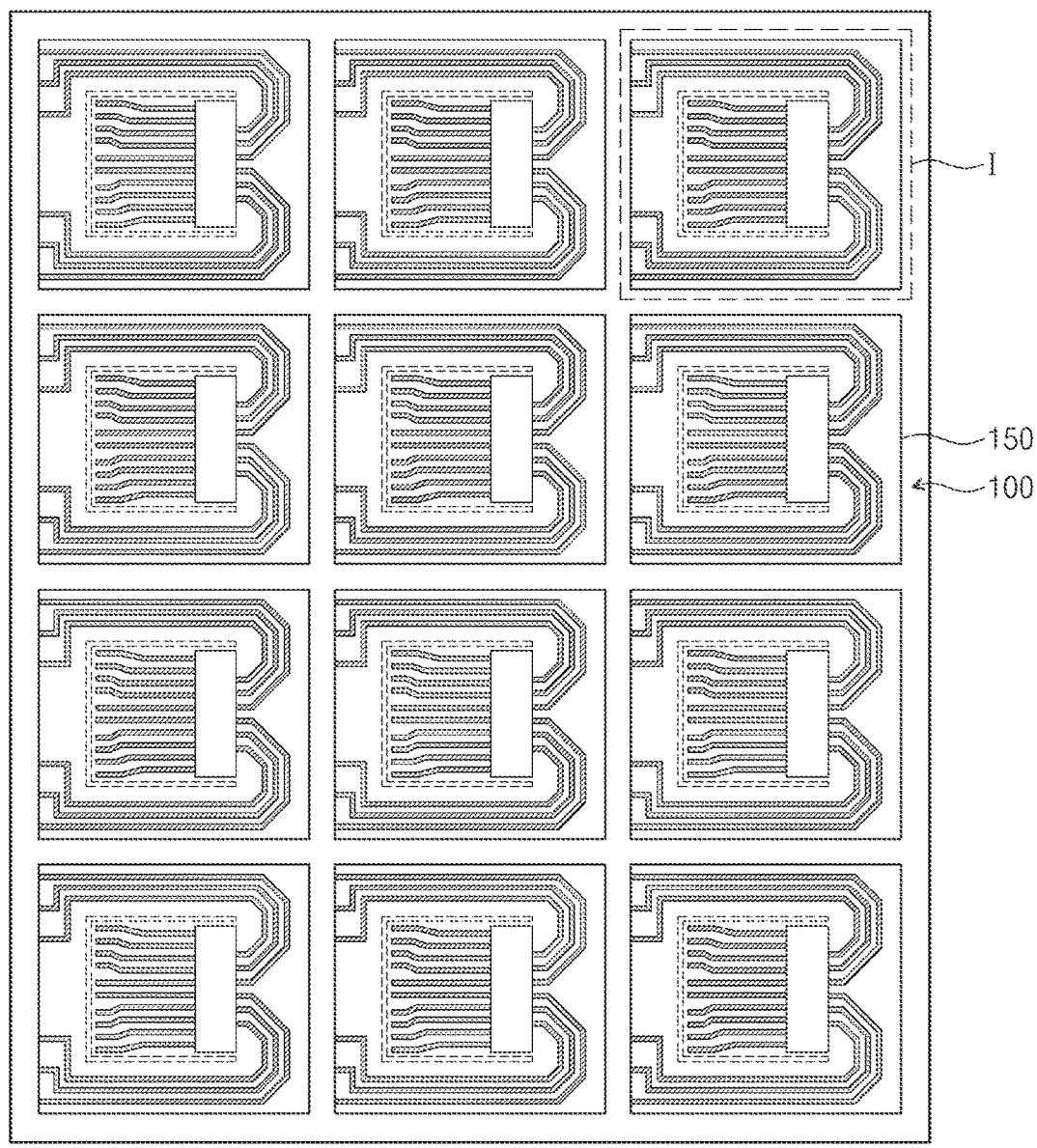
FIG. 1A illustrates the layout of a film package structure according to an embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view.

Semiconductor packages and package modules according to embodiments of the inventive concepts will now be described.

Figure 1B:
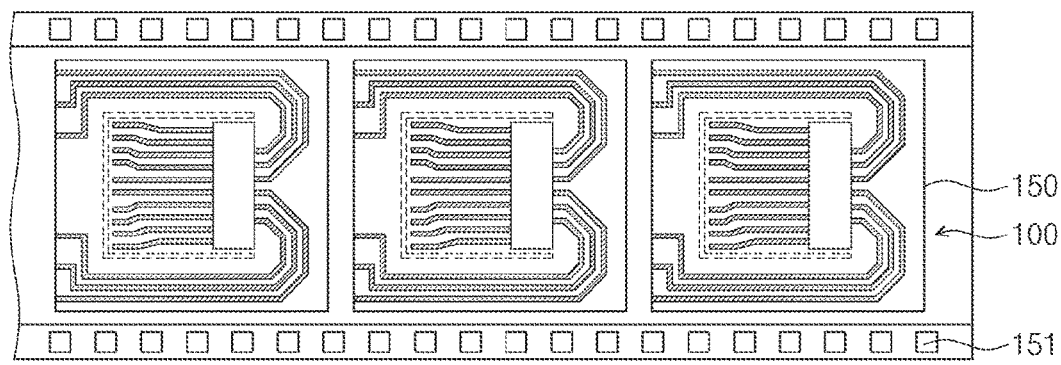
FIG. 1B illustrates the layout of a film package structure according to an embodiment of the inventive concepts.

FIG. 1A illustrates the layout of a film package structure according to an embodiment of the inventive concepts. FIG. 1B illustrates the layout of a film package structure according to another embodiment of the inventive concepts.

Referring to FIGS. 1A and 1B, a film package FPKG1 or FPKG2 may include a plurality of semiconductor packages 100. The semiconductor packages 100 may be chip-on-film (COF) packages. The semiconductor packages 100 may be laterally spaced apart from each other and may be defined by a saw or cut line 150. It will be understood that the saw line 150 may be imaginary in that it may not be physically present. Rather, the saw line 150 represents were the packages FPKG1 and FPKG2 may be cut to extract each of the semiconductor packages 100. In the example of FIG. 1A, the semiconductor packages 100 are arrayed in multiple rows and columns. On the other hand, in the example of FIG. 1B, the semiconductor packages 100 may be arranged in a single row. Also, in the embodiment of FIG. 1B, sprocket holes 151 are arranged in each edge region of the film package FPKG2. These sprocket holes 151 may be used for conveyance and/or alignment of the film pack FPKG2 during fabrication using one or more sprocket reels (not shown).

Figure 2A:
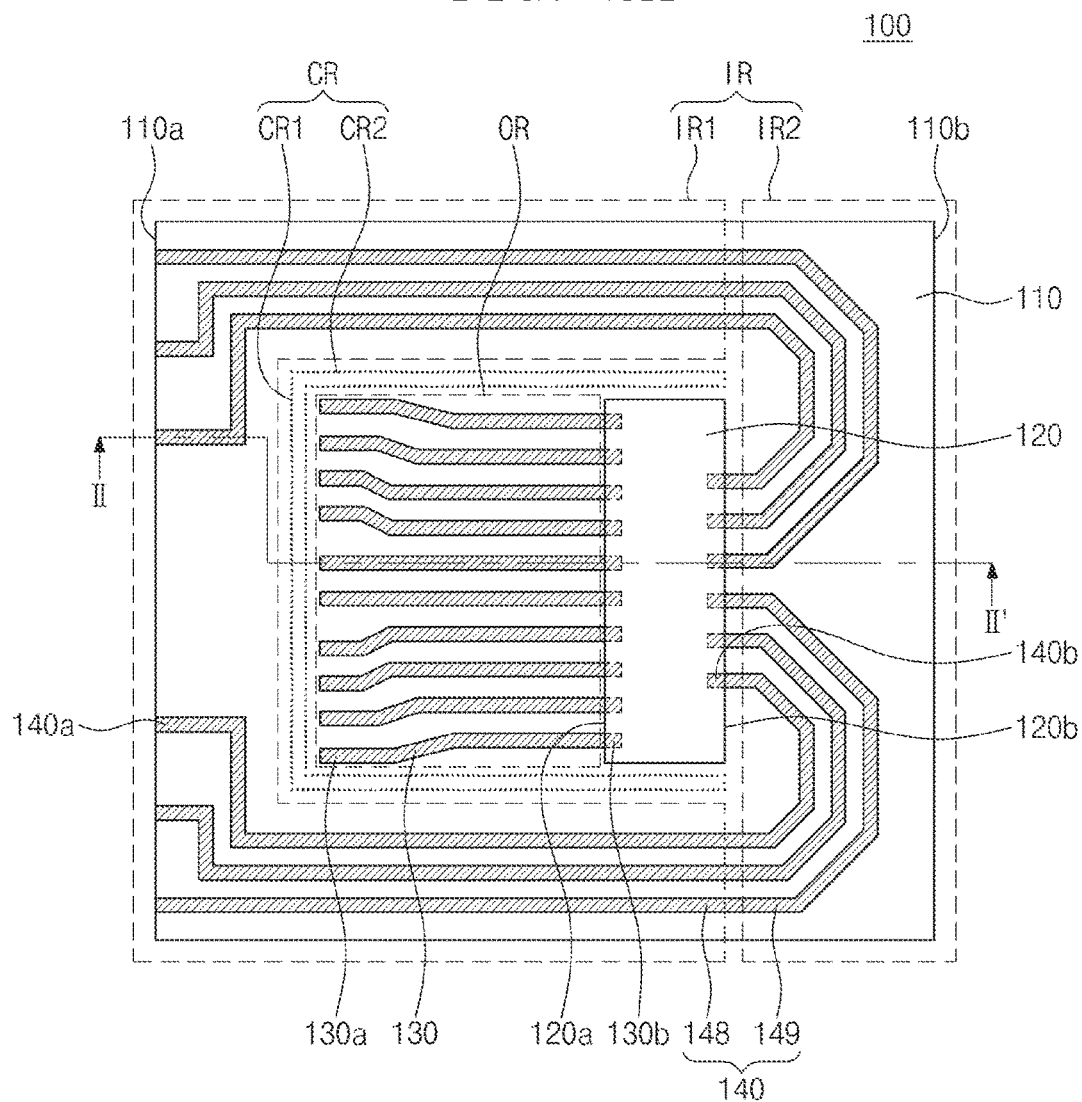
FIG. 2A, which corresponds to 'I' of FIG. 1A, is a plan view illustrating a semiconductor package according to an embodiment of the inventive concepts.
Figure 2B:
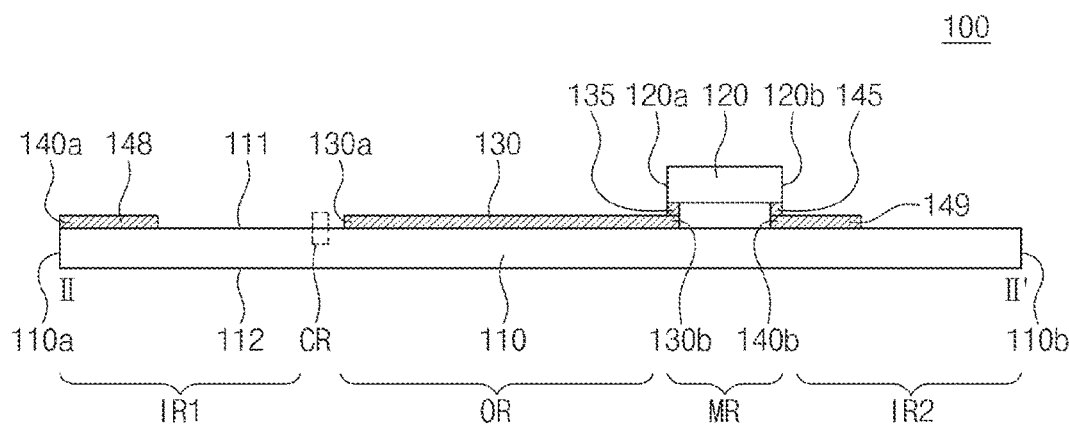
FIG. 2B is a cross-sectional view taken along a line II-II' of FIG. 2A.

Hereinafter, a semiconductor package 100 among the plurality of semiconductor packages 100 illustrated in FIGS. 1A and 1B will be described with reference to FIGS. 2A and 2B. FIG. 2A is an enlarged plan view of a region 'I' of FIG. 1A. FIG. 2B is a cross-sectional view taken along line II-II' of FIG. 2A.

The semiconductor package 100 may include a film substrate 110, a semiconductor chip 120, output interconnection lines 130, and input interconnection lines 140.

The film substrate 110 may for example be formed of a polymer material (e.g., polyimide or polyester) and may be a flexible film substrate. Here, as will be understood from the description below, the term "flexible" means horizontal regions of the substrate separated by a cut line are capable of being vertically displaced relative to one another without detachment or breakage from the substrate. For purposes of description, the film substrate 110 includes a first surface 111 and an opposite second surface 112 that each generally lie in horizontal plane, and a first sidewall 110a and an opposite second sidewall 110b that each extend between the first surface 111 and the second surface 112.

In the example of this embodiment, the semiconductor chip 120 is located on a chip mounting region MR of the first surface 111 of the film substrate 110. Also, for purposes of description, the semiconductor chip 120 includes first sidewall 120a facing towards the first sidewall 110a of the film substrate 110, and a second sidewall 120b facing towards the second sidewall 110b of the film substrate 110.

The output interconnection lines 130 are formed of a conductive material (e.g., metal lines or traces) and are disposed on an output region OR of the film substrate 110. The output region OR may be centrally located on the film substrate 110, when viewed in a plan view, between the first sidewall 120a of the semiconductor chip 120 and the first sidewall 110a of the film substrate 110. Thus the output region OR may be an inner region of the film substrate 110. In the example of this embodiment, the output interconnection lines 130 are disposed on the first surface 111 of the output region OR of the film substrate 110.

The output interconnection lines 130 each include a first end 130a (i.e., a distal end) and a second end 130b (i.e., proximal end). The first ends 130a of the output interconnection lines 130 may be located along an edge of the output region OR located between the chip mounting region MR and the first sidewall 100a of the film substrate 110. The second ends 130b of the output interconnection lines 130 may be located at an interface between the chip mounting region MR and the output region OR. A long axis of the output interconnection lines 130 may generally extend from the chip mounting region MR in a direction towards the first sidewall 110a of the film substrate 110. In the example of FIG. 2B, output terminals 135 are disposed between the second ends 130b of the output interconnection lines 130 and the semiconductor chip 120. The second end 130b of the output interconnection lines 130 may be in contact with the output terminal 135, so the output interconnection lines 130 and the semiconductor chip 120. In this way, the output interconnection lines 130 are electrically connected to the semiconductor chip 120.

The input interconnection lines 140 are formed of a conductive material (e.g., metal lines or traces) and disposed on an input region IR of the film substrate 110. In a plan view, the input region IR may be located around a periphery of the film substrate 110 so as to surround the output region OR and the chip mounting region MR. Thus, the input region IR may be an inner region of the film substrate 110. In the example of this embodiment, the input interconnection lines 140 are disposed on the first surface 111 of the input region IR of the film substrate 110. For purposes of explanation, the input region IR is divided into a first input region IR1 adjacent to the first sidewall 110a of the film substrate 110 and surrounding three sides of the output region OR, and a second input region IR2 adjacent to the second sidewall 110b of the film substrate 110 and the second sidewall 120b of the semiconductor chip 120.

The input interconnection lines 140 each include a first end 140a (i.e., a distal end) and second end 140b (i.e., a proximal end). In addition, the input interconnection lines 140 may each include a first portion 148 disposed on the first input region IR1 and a second portion 149 disposed on the second region IR2. In the example of FIG. 2A, the second portions 149 of the input interconnection lines 140 extend from the second sidewall 120b of the semiconductor chip 120 and are arced or curved (in a plan view) to connect with the first portions 148 of the input interconnection lines 140. The arced or curved configuration of the second portions 149 can take any of a number of different forms, and in this example, that form is semi-polygonal (i.e., a series of connected straight line segments). Also in the example of FIG. 2A, the first portions 148 of the input connection lines 140 extends from the first sidewall 110a of the film substrate 110 to connect with second portions 149 of the input interconnection lines 140. As shown, one or more of the second portions 149 may be non-linear or stepped in a plan view.

Each first end 140a of the input interconnection lines 140 may be located at or near the first sidewall 110a of the film substrate 110, and each second end 140b of the input interconnection lines 140 may be located at or near the semiconductor chip 120. In the example of this embodiment, each first end 140a of the input interconnection lines 140 is flush with the first sidewall 110a, and each second end 140b of the input interconnection lines 140 is located below the semiconductor chip 120. In this case, as illustrated in FIG. 2B, an input terminal 145 may be disposed between the film substrate 110 and the semiconductor chip 120 and may be adjacent to the second sidewall 120b of the semiconductor chip 120. The second end 140b of the input interconnection lines 140 may be in contact with the input terminal 145 of the semiconductor chip 120 for electrical connection of the input interconnection lines 140 to the semiconductor chip 120.

The input interconnection lines 140 and the input terminal 145 may include a conductive material (e.g., a metal). Also, the input interconnection lines 140 and the output interconnection lines 130 may be formed in the same formation process. The material of the input interconnection lines 140 may be the same as that of the output interconnection lines 130, and a thickness of the input interconnection lines 140 may be equal to that of the output interconnection lines 130.

As will be seen in FIG. 2A, the interconnection lines routed through the input region IR are more complex and longer than those routed through the output region OR. Also, in the example illustrated in FIG. 2A, the total number of the input interconnection lines 140 is less than the total number of the output interconnection lines 130, although the inventive concepts are not limited in this fashion. The output interconnection lines 130 may be provided on the core of the film substrate 110 and the input interconnection lines 140 may be provided on the edge region of the film substrate 110.

In other embodiments, a protection layer (not shown) may be provided on the first surface 111 of the film substrate 110 to cover the output and input interconnection lines 130 and 140.

FIGS. 2A and 2B further illustrate a cut line CR that extends between the input (or "outer") region IR and the three sides of the combined output ("inner") region OR and chip mounting region MR when viewed from a plan view. Thus, the cut line CR loops around the output interconnection lines 130 and terminates at locations adjacent opposite ends of the chip mounting region MR, respectively. It is noted that the cut line CR may be an imaginary region indicative of where a cutting or sawing operation may later take place. Alternatively, the cut line CR may be physically present as a marking, trench or feature of some type on the film substrate 110. For purposes of explanation, the cut line CR is described here as including a first cut line CR1 and second cut lines CR2. The first cut line CR1 may be provided between the first end 130a of the output interconnection lines 130 and the input interconnection lines 140. The first cut line CR1 may be parallel to the first sidewall 110a of the film substrate 110. The second cut lines CR2 may be connected to both ends of the first cut line CR1, respectively, and may terminate at locations adjacent opposite ends of the chip mounting region MR, respectively. The second cut lines CR2 may extend in a direction intersecting the first sidewall 110a of the film substrate 110.

Eventually, in examples of the inventive concept, the cut line CR is made to pass vertically through the film substrate 110 so as to horizontally separate the output region OR of the film substrate 110 from a tab constituted by the combined input region IR and chip mounting region of the film substrate 110. This can be done either before or during the cutting of the saw line 150 of FIGS. 1A and 1B, or after the film package substrates of FIGS. 1A and 1B are separated into individual semiconductor packages 100. The method of cutting is not limited, and can be realized for example by sawing with a blade, laser or the like. As will be described next by way of exemplary embodiments, the flexibility of the film substrate 100 allows a vertical position of the distal ends 130a of the output interconnection lines 130 to be adjusted or displaced relative to a vertical position of the distal ends 140a of the input interconnection lines. This can be done by vertically displacing the tab, i.e., the combined output region OR and chip mounting region MR of the film substrate 110, relative to the input region IR of the film substrate 110 at the cut line CR. In other words, the flexible film substrate 110 may be configurable between a first orientation (e.g., as in FIG. 2B) in which the output region OR is coplanar with the input region IR in a side view, and a second orientation (e.g., as in FIG. 3B described below) in which the output region OR extends at an angle from the input region IR in the side view. In other words, the combined output region OR and chip mounting region MR may subtend an acute angle with the input region IR. In this manner, as described in connection of example package modules of the inventive concepts, one or more semiconductor chips or electronic devices can be interposed between and connected to the distal ends 130a and 140a of the output and input interconnection lines 130 and 140.

Figure 3A:
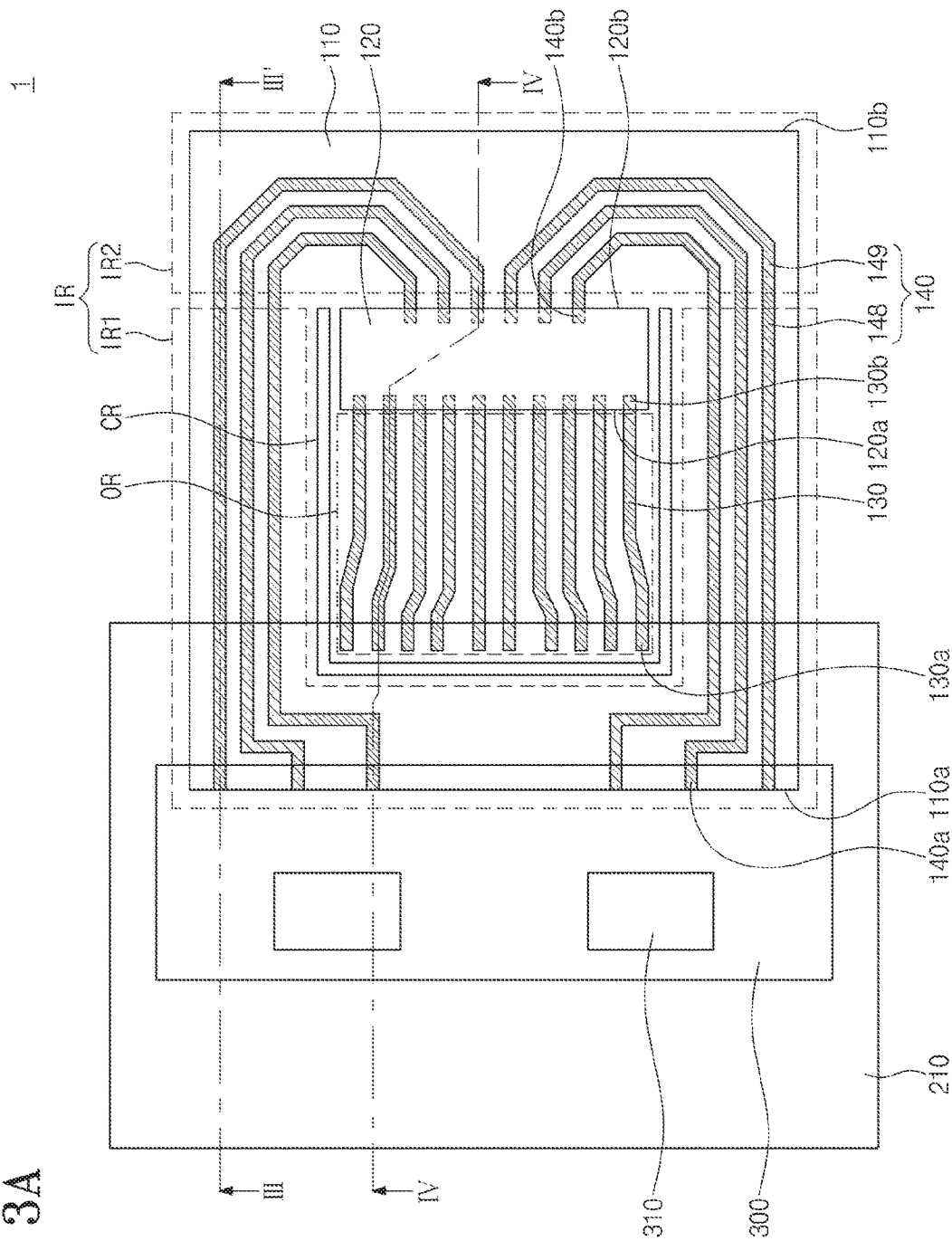
FIG. 3A is a plan view illustrating a package module according to an embodiment of the inventive concepts.
Figure 3B:
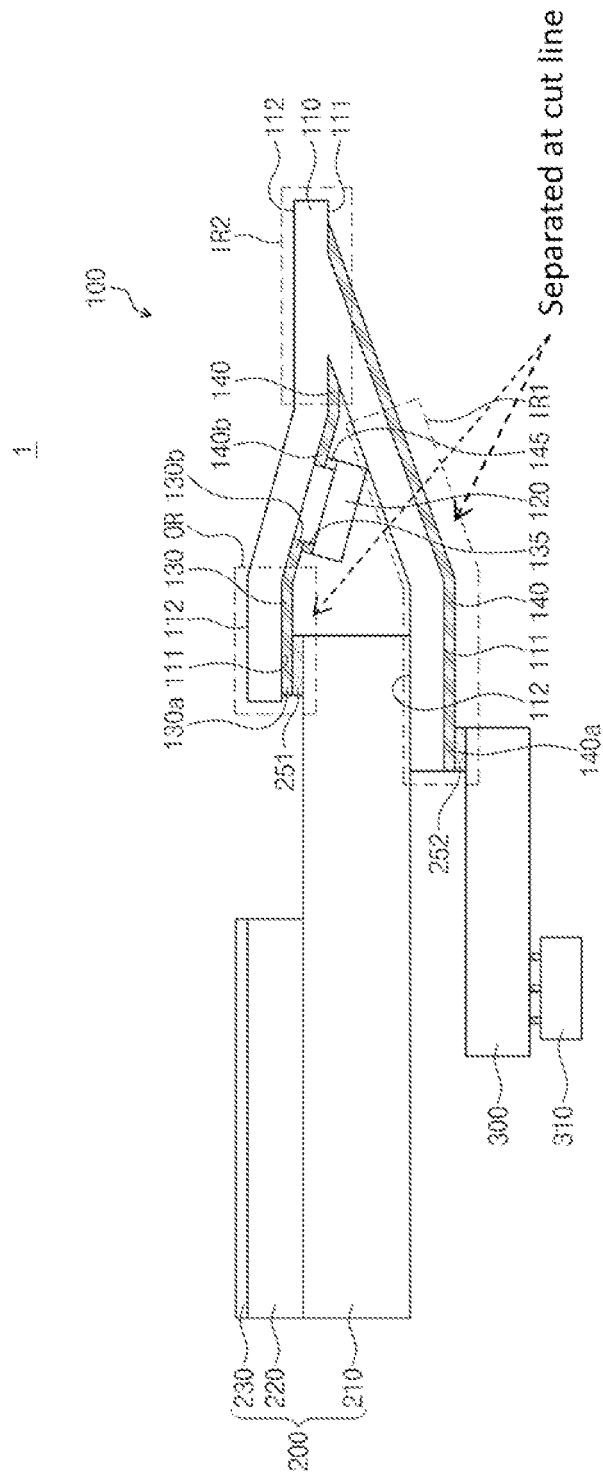
FIG. 3B is a side view of the package module of FIG. 3A.
Figure 3C:
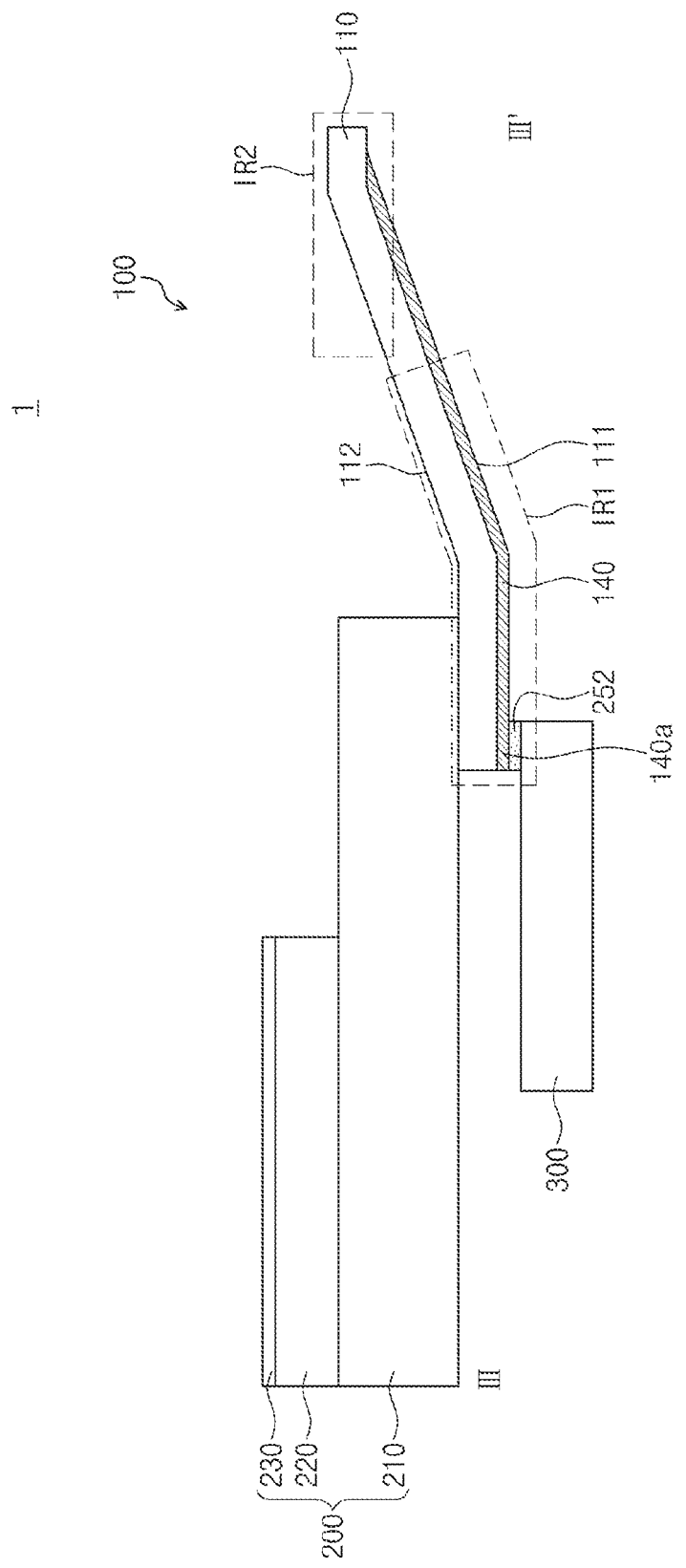
FIGS. 3C and 3D are cross-sectional views taken along lines and IV-IV' of FIG. 3A, respectively.
Figure 3D:
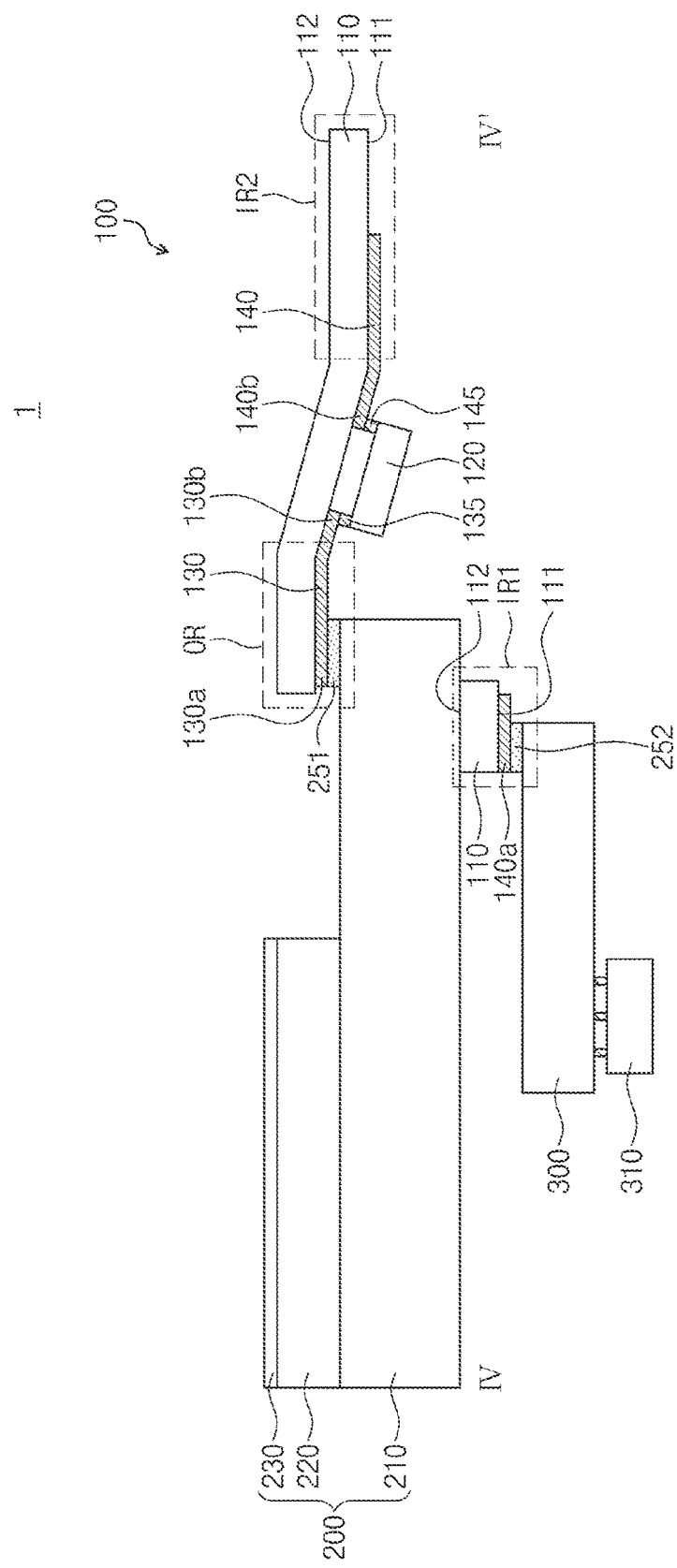

FIG. 3A is a plan view illustrating a package module according to an embodiment of the inventive concepts. FIG. 3B is a side view of the package module of FIG. 3A. FIGS. 3C and 3D are cross-sectional views taken along lines and IV-IV' of FIG. 3A, respectively. It is noted that like reference numbers refer to like elements in FIGS. 2A and 2B and FIGS. 3A to 3D. Thus, to avoid redundancy in the description, elements already described with reference to FIGS. 2A and 2B may not again be described in connection with FIGS. 3A to 3D.

Referring to FIGS. 3A to 3D, a package module 1 of the example of this embodiment is a display device assembly that includes a semiconductor package 100, a display device 200, and a circuit substrate 300. The semiconductor package 100, which may be the same as or similar to the semiconductor package 100 of FIGS. 2A and 2B in which the cut line vertically penetrates through the film substrate 110, functions to connect the circuit substrate 300 to a panel substrate 210.

As described previously, the semiconductor package 100 includes a film substrate 110, a semiconductor chip 120 located in a chip mounting region MR, one or more output interconnection lines 130 located in an output region OR, and one or more input interconnection lines 140 located in an input region IR. The input region IR and the output region OR are horizontally separated by a cut line CR penetrating vertically through the film substrate 110

The display panel 200 of this example includes a panel substrate 210, a display panel 220, and a protection film 230. In the package module 1, the output region OR of the film substrate 110 may be disposed on a top surface of the panel substrate 210. The input region IR of the film substrate 110 may include the first input region IR1 disposed on a bottom surface of the panel substrate 210 and the second input region IR2 next to on a sidewall of the panel substrate 210. The first input region IR1 may be connected to the output region OR through the second input region IR2. For example, the first surface 111 of the first input region IR1 may be connected to the first surface 111 of the output region OR through the first surface 111 of the second input region IR2. The second surface 112 of the first input region IR1 may be connected to the second surface 112 of the output region OR through the second surface 112 of the second input region IR2.

The panel substrate 210 may be disposed between the first input region IR1 and the output region OR of the semiconductor package 100. The first surface 111 of the output region OR of the film substrate 110 may face the panel substrate 210, and the output interconnection lines 130 may be disposed on the first surface 111 of the output region OR. A first connection film 251 may be disposed between the output interconnection lines 130 and the panel substrate 210. The first connection film 251 may include an anisotropic conductive film (ACF). For example, the first connection film 251 may include an adhesive polymer and conductive particles provided within the adhesive polymer. The output interconnection lines 130 may be electrically connected to the panel substrate 210 through the first connection film 251. The panel substrate 210 may be connected to the output region OR of the film substrate 110.

The display panel 220 may be disposed on the top surface of the panel substrate 210. The display panel 220 may be a liquid crystal panel or an organic light-emitting panel. However, these are just examples and the inventive concepts are not limited thereto. In addition, although not shown, the display panel 220 may include a thin-film transistor substrate and a color-filter substrate which are opposite to each other, and liquid crystal may be injected into between the thin-film transistor substrate and the color-filter substrate. In this case, a light transmittance of the liquid crystal may be adjusted using a thin-film transistor (TFT) as a switching element to cause the display panel 220 to display an image. In this case, the display device 200 may further include a backlight assembly (not shown) which provides light to the display panel 220. The protection film 230 may be disposed on the display panel 220. In other embodiments, the protection film 230 may be omitted.

The circuit substrate 300 may be a flexible printed circuit board (FPCB), and may be provided on the bottom surface of the panel substrate 210. The first input region IR1 of the film substrate 110 may be disposed between the circuit substrate 300 and the panel substrate 210, and the circuit substrate 300 may be connected to the first input region IR1. For example, the first surface 111 of the first input region IR1 of the film substrate 110 may face the circuit substrate 300. The input interconnection lines 140 may be provided on the first surface 111 of the film substrate 110. A second connection film 252 may be disposed between the input interconnection lines 140 and the circuit substrate 300, so the input interconnection lines 140 may be electrically and physically connected to the circuit substrate 300. The second connection film 252 may include, for example, an anisotropic conductive film (ACF). The circuit substrate 300 may overlap with the panel substrate 210 when viewed from a plan view (as in FIG. 3A).

One or more passive devices 310 may be disposed on a bottom surface of the circuit substrate 300. Examples of the passive devices 310 include inductors, a resistors, capacitors, connecters and so on. The passive devices 310 may be electrically connected to the input interconnection lines 140 through the circuit substrate 300. For example, the circuit substrate 300 may supply a timing signal, an image signal, and/or a power signal to the semiconductor chip 120 through the input interconnection lines 140.

In some conventional chip-on-film packages, a film substrate is bent all the way over to form a loop such that opposite edge regions of a same surface of the film substrate face each other with a semiconductor chip or other device there between. Such a looping configuration creates significant stress on the interconnection lines of film substrate, which can cause the interconnection lines to crack or break. Stresses of that type are inhibited according to embodiments of the inventive concepts since curvature of the film substrate is minimized That is, as can be seen in FIG. 3B, the film substrate 110 has a relatively small curvature in some portions, and no curvature at all in other portions, and thus stress on the output interconnection lines 130 and the input interconnection lines 140 is minimized.

The semiconductor chip 120 may be disposed on the first surface 111 of the film substrate 110. The semiconductor chip 120 may receive signals from the circuit substrate 300 through the input interconnection lines 130. The semiconductor chip 120 may include a gate driving integrated circuit and/or a data driving integrated circuit to generate a gate driving signal and/or a data driving signal. The electrical signals generated from the semiconductor chip 120 may be provided to gate lines and/or data lines of the panel substrate 210 through the output interconnection lines 130, so the display panel 220 may be driven.

Figure 4A:
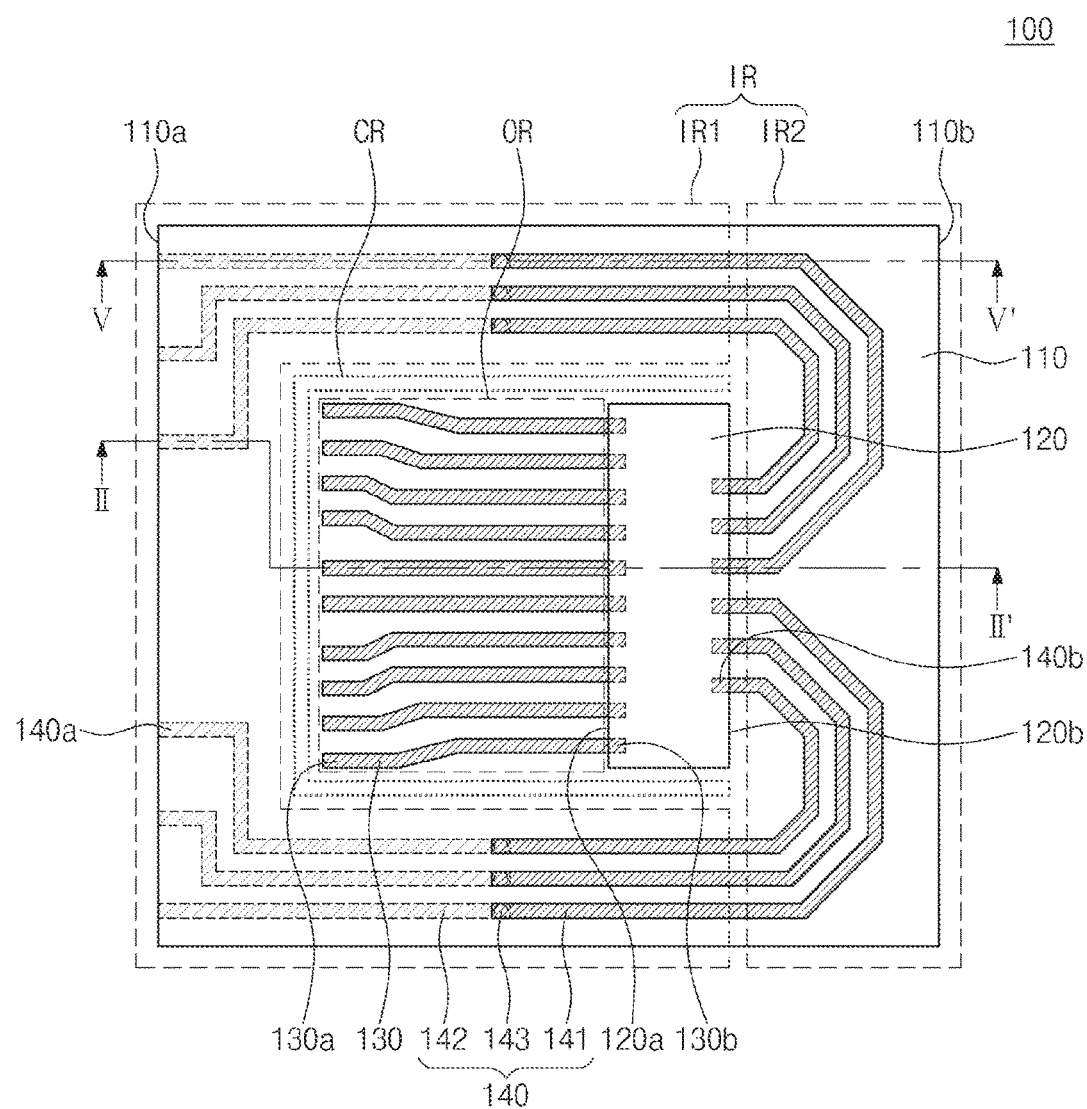
FIG. 4A is a plan view illustrating a semiconductor package according to an embodiment of the inventive concepts.
Figure 4B:
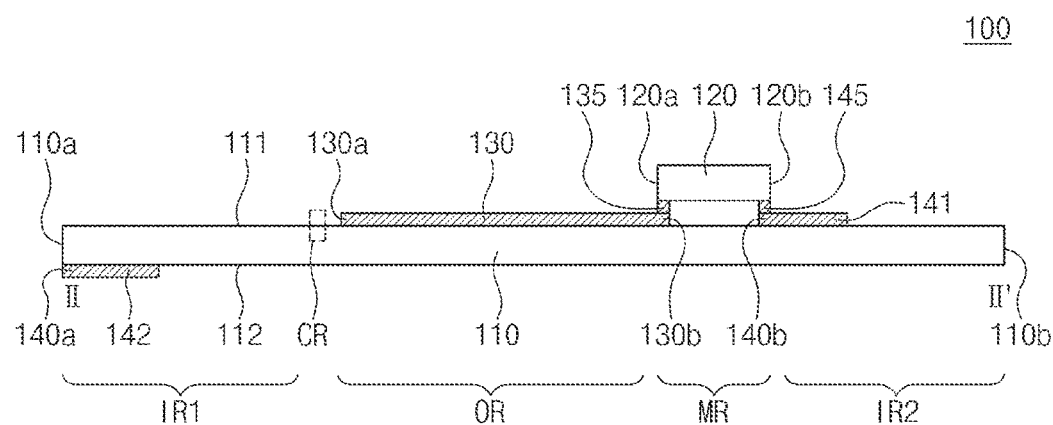
FIGS. 4B and 4C are cross-sectional views taken along lines II-II' and V-V' of FIG. 4A, respectively.
Figure 4C:
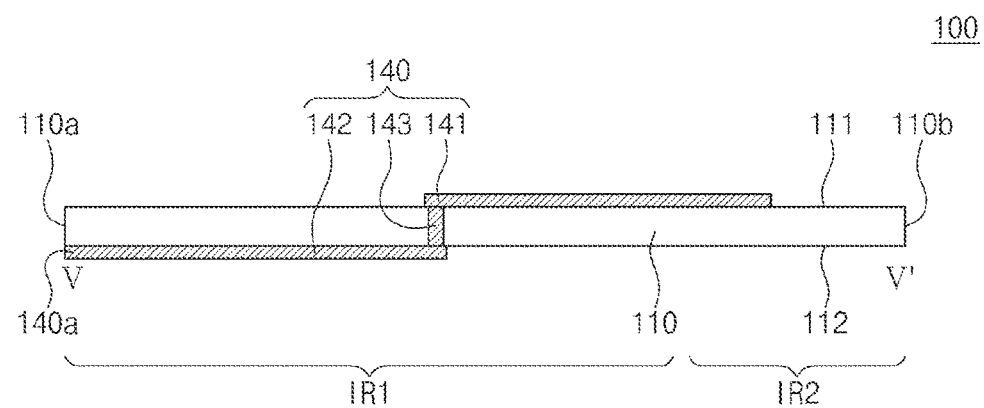

FIG. 4A is a plan view illustrating a semiconductor package according to an embodiment of the inventive concepts. FIGS. 4B and 4C are cross-sectional views taken along lines II-II' and V-V' of FIG. 4A, respectively. To avoid redundancy in the description, elements already described and with like reference numbers may not again be described in connection with FIGS. 4A through 4C.

The semiconductor package of FIGS. 4A through 4C is essentially the same as that of FIGS. 2A and 2B, except that input interconnection lines 140 each include a first interconnection line 141 on the first surface 111 of the film substrate 110, a second interconnection line 142 on the second surface 112 of the film substrate 110, and a via 143 penetrating through the film substrate 110 and connecting the first interconnection line 141 to the second interconnection line 142. The via 143 is formed of a conductive material such as a metal. As such, in contrast to the embodiments of FIGS. 2A and 2B, the distal end 140a of each input interconnection line 140 is located on the second surface 112 of the substrate 110 adjacent the first sidewall 110a of the film substrate 110. Also, in the example of this embodiment, the via 143 is located in the first input region IR1. However, the inventive concepts are not limited in this manner, and the via 143 may instead be located in the first input region IR2.

Figure 5B:
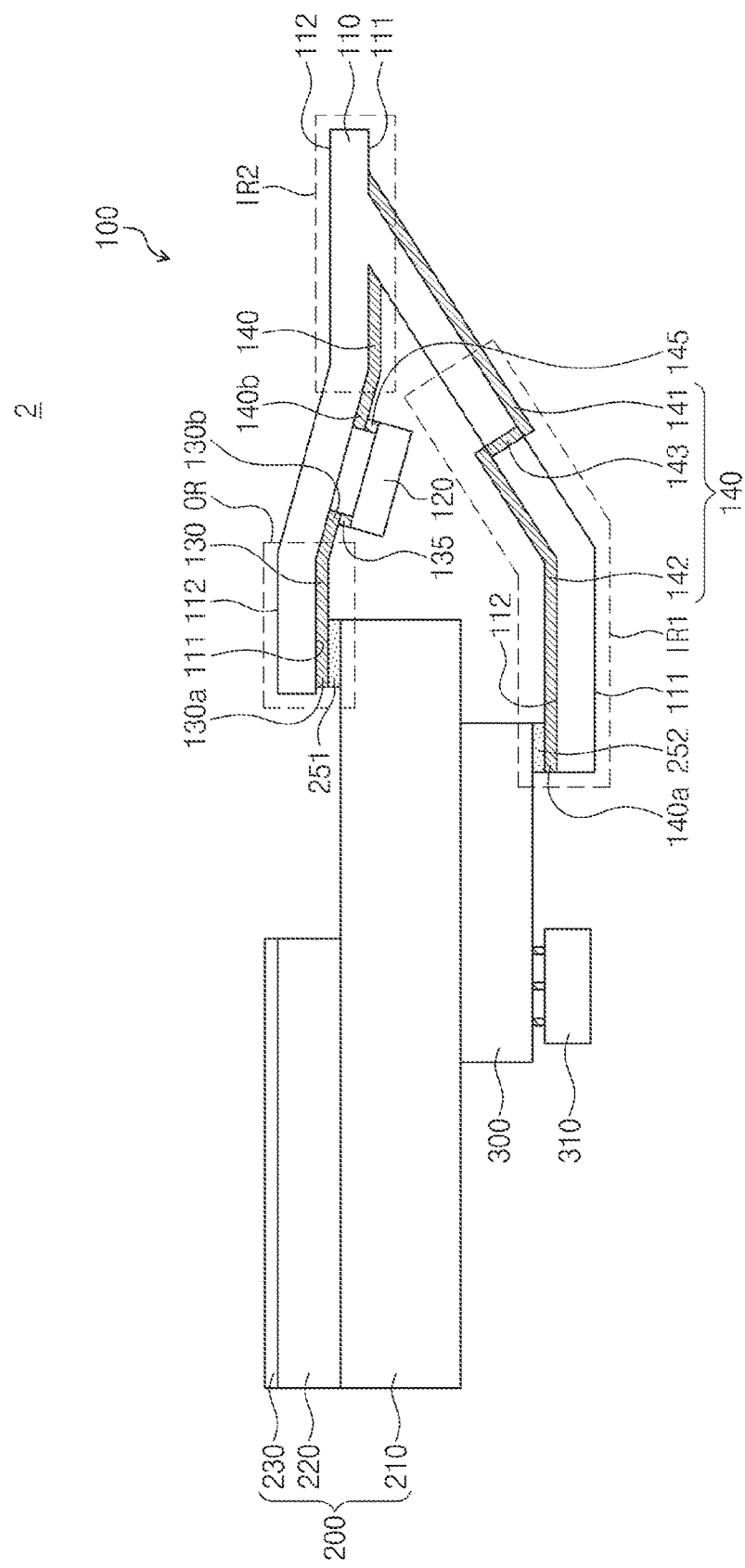
FIG. 5B is a side view of the package module of FIG. 5A.

FIG. 5A is a plan view illustrating a package module including the semiconductor package 100 of FIGS. 4A to 4C according to an embodiment of the inventive concepts. FIG. 5B is a side view of the package module of FIG. 5A. To avoid redundancy in the description, elements already described and with like reference numbers may not again be described in connection with FIGS. 5A and 5B.

The package module 2 of FIGS. 5A and 5B is essentially the same as package module 1 of FIGS. 3A through 3D described above, except that the semiconductor package is configured as in FIGS. 4A to 4C, and panel substrate 210 and circuit substrate 300 are sandwiched between the distal ends 130a and 140a of the output and input interconnection lines 130 and 140 as best shown in FIG. 5B. As such, the input interconnection lines 140 are connected via a second connection film 252 at a bottom surface of the circuit substrate 300, which is the surface having the passive devices 310.

Figure 6A:
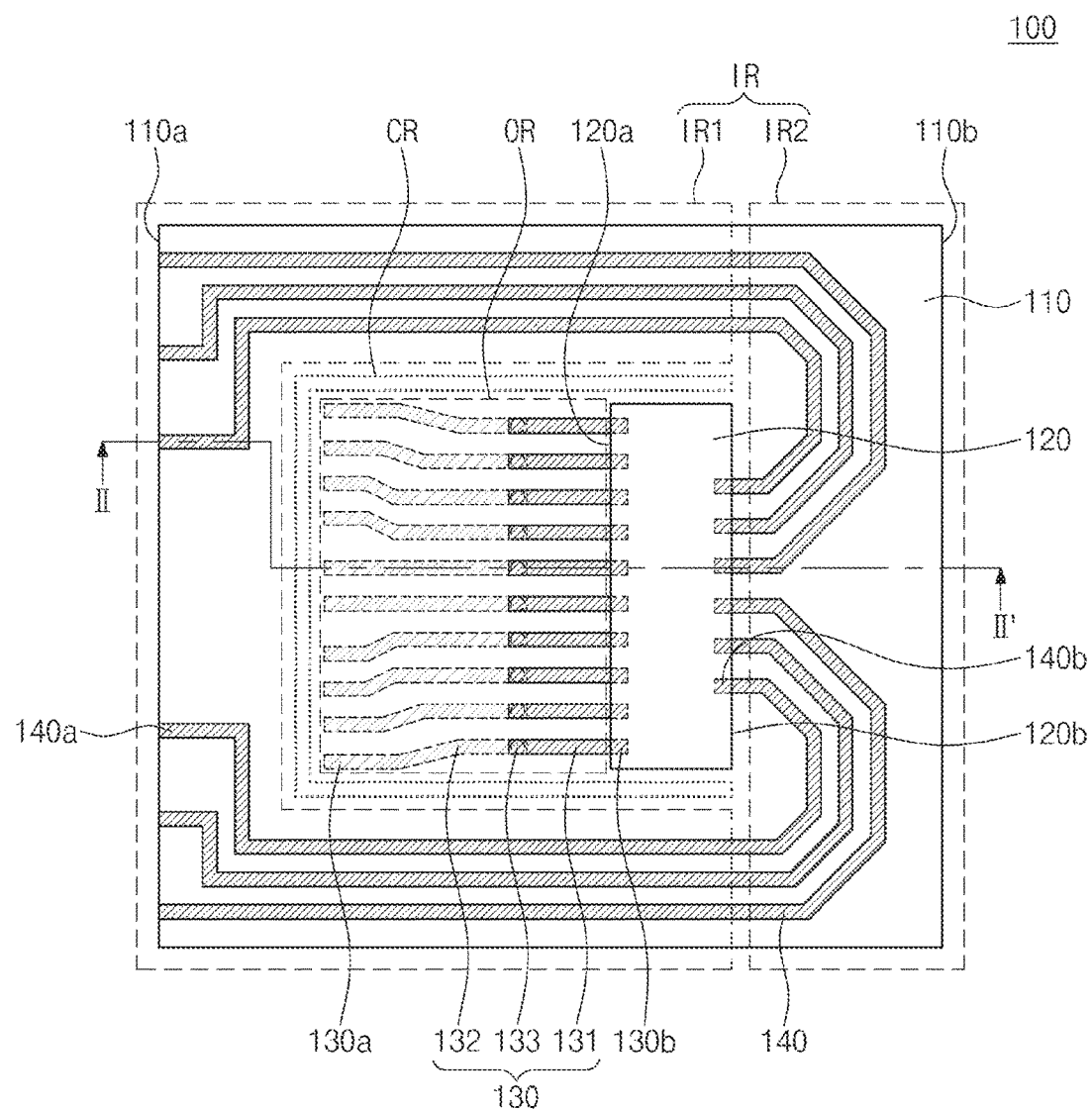
FIG. 6A is a plan view illustrating a semiconductor package according to an embodiment of the inventive concepts.
Figure 6B:
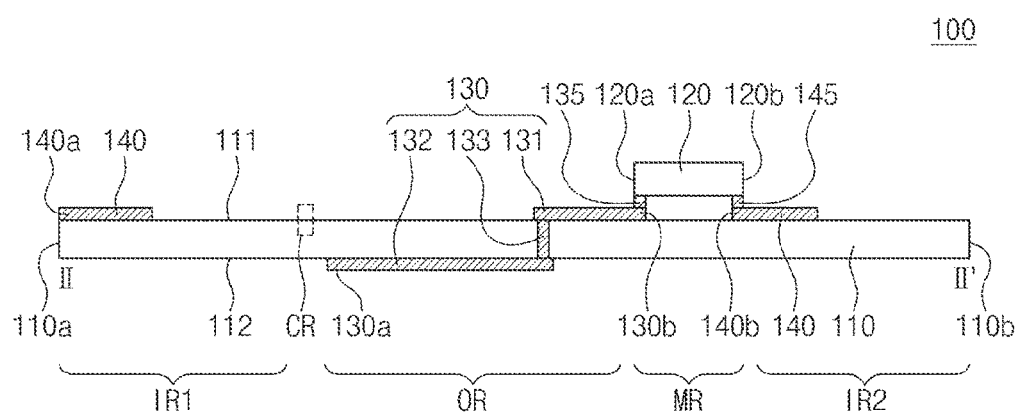
FIG. 6B is a cross-sectional view taken along a line II-II' of FIG. 6A.

FIG. 6A is a plan view illustrating a semiconductor package according to an embodiment of the inventive concepts. FIG. 6B is a cross-sectional view taken along a line II-II' of FIG. 6A. To avoid redundancy in the description, elements already described and with like reference numbers may not again be described in connection with FIGS. 6A and 6B.

The semiconductor package of FIGS. 6A and 6B is essentially the same as that of FIGS. 2A and 2B, except that output interconnection lines 130 each include a first interconnection line 131 on the first surface 111 of the film substrate 110, a second interconnection line 132 on the second surface 112 of the film substrate 110, and a via 133 penetrating through the film substrate 110 and connecting the first interconnection line 131 to the second interconnection line 132. The via 133 is formed of a conductive material such as a metal. As such, in contrast to the embodiments of FIGS. 2A and 2B, the distal end 130a of each output interconnection line 130 is located on the second surface 112 of the substrate 110 adjacent the first sidewall 110a of the film substrate 110. In the example of this embodiment, the via 133 is located in the output region OR at a position which is closer to the semiconductor chip 120 than the cut line CR1 (FIG. 2A). However, the inventive concepts are not limited in this manner, and the vias 133 may be located elsewhere in the output region OR.

Figure 7A:
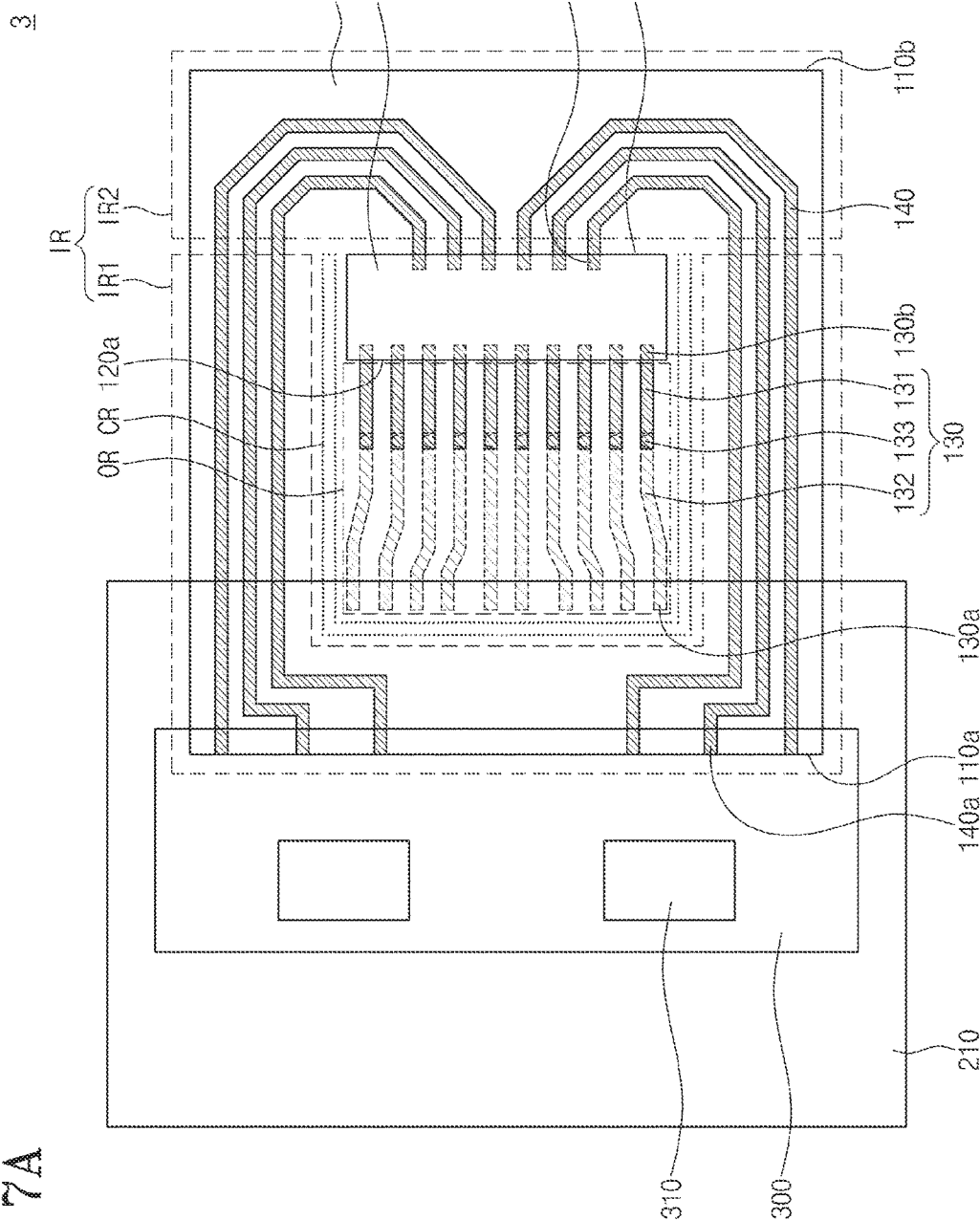
FIG. 7A is a plan view illustrating a package module according to an embodiment of the inventive concepts.
Figure 7B:
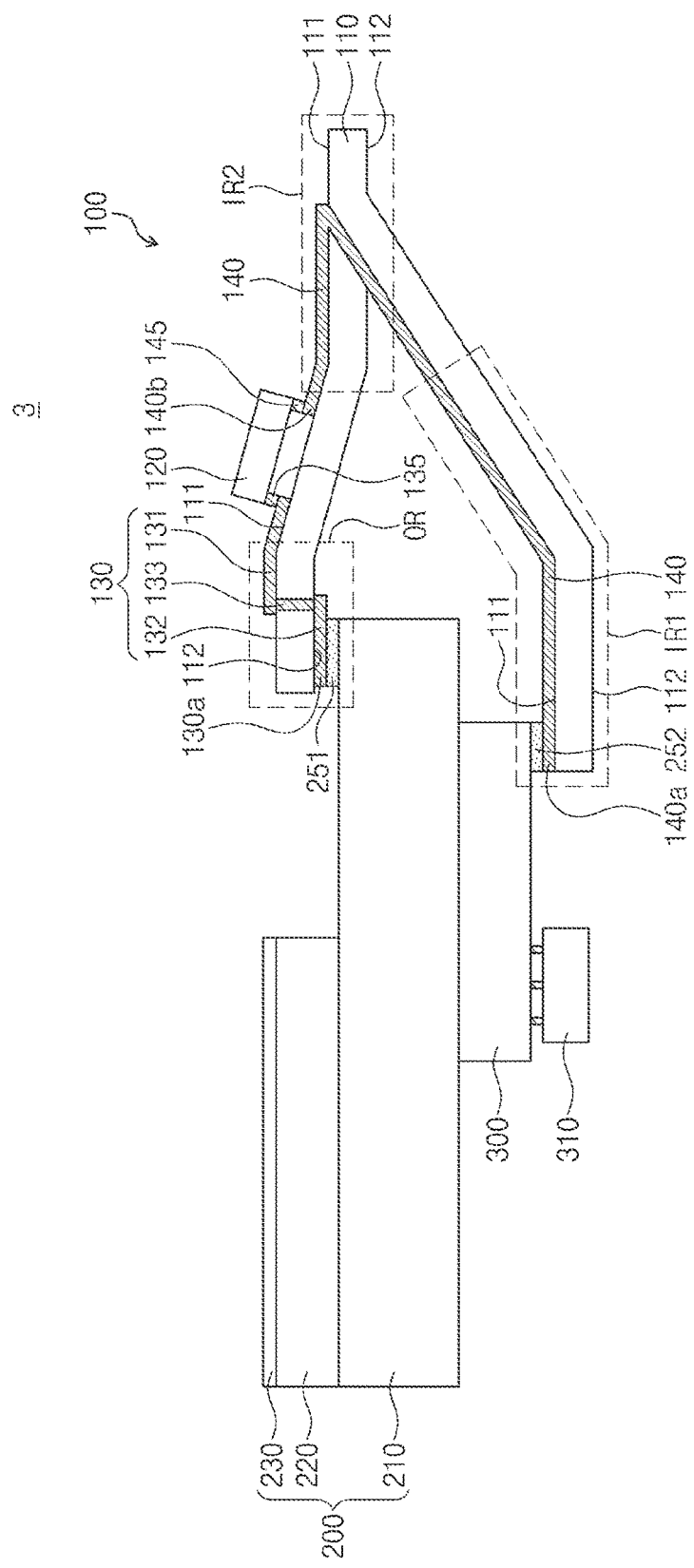
FIG. 7B is a side view of the package module of FIG. 7A.

FIG. 7A is a plan view illustrating a package module including the semiconductor package 100 of FIGS. 6A and 6B according to an embodiment of the inventive concepts. FIG. 7B is a side view of the package module of FIG. 7A. To avoid redundancy in the description, elements already described and with like reference numbers may not again be described in connection with FIGS. 7A and 7B.

The package module 3 of FIGS. 7A and 7B is essentially the same as package module 2 of FIGS. 5A and 5B described above, except that the semiconductor package is configured as in FIGS. 6A and 6B, and the first surface 111 of the film substrate 110 is oriented upwardly in the cross-sectional view of FIG. 7B, whereas the second surface 112 is oriented downwardly in the cross-sectional view of FIG. 7B. As such, the semiconductor chip 120 faces upwardly, and output interconnection lines 130 are connected to the panel substrate 210 via a first connection film 251 at the second surface 112 of the film substrate 110.

Figure 8A:
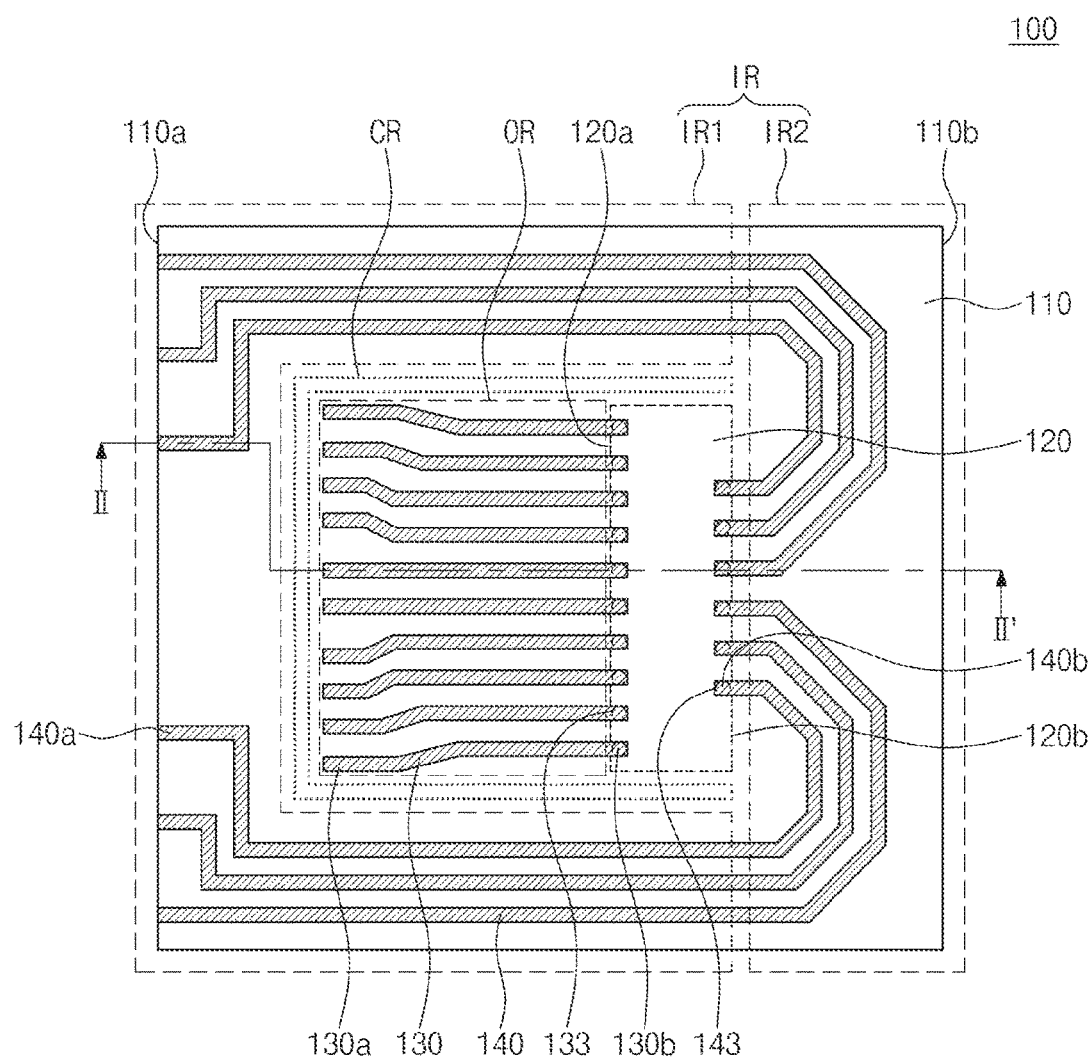
FIG. 8A is a plan view illustrating a semiconductor package according to an embodiment of the inventive concepts.
Figure 8B:
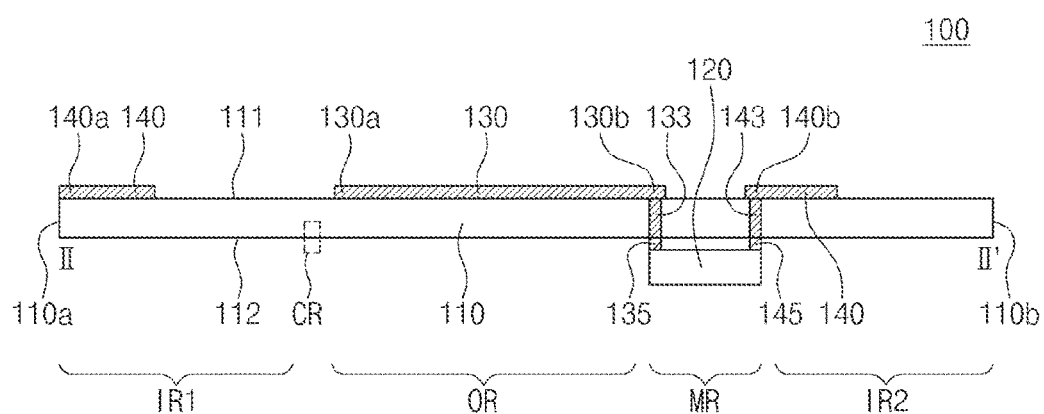
FIG. 8B is a cross-sectional view taken along a line II-II' of FIG. 8A.

FIG. 8A is a plan view illustrating a semiconductor package according to an embodiment of the inventive concepts. FIG. 8B is a cross-sectional view taken along a line II-II' of FIG. 8A. To avoid redundancy in the description, elements already described and with like reference numbers may not again be described in connection with FIGS. 8A and 8B.

The semiconductor package 100 of FIGS. 8A and 8B is essentially the same as that of FIGS. 2A and 2B, except that the semiconductor chip 120 is located on an opposite surface of the film substrate 110, i.e., the semiconductor chip 120 is located on the second surface 112 of the film substrate 110. As such, output vias 133 are provided which penetrate the film substrate 110 to connect the output interconnection lines 130 to the output terminals 135, and input vias 143 are provided which penetrate the film substrate 110 to connect the input interconnection lines 140 to the output terminals 145. The input and output vias 133 and 143 are formed of a conductive material such as a metal.

In the example of FIGS. 8A and 8B, the semiconductor chip 120 overlaps the input and output vias 133 and 143.

However, the inventive concepts are not limited in this manner. For example, one or more of the input and output vias 133 and 143 may be horizontally spaced from the semiconductor chip 120, and electrically connected to the input and output terminals 135 and 145 by conductive lines or traces on the second surface of the film substrate 110.

Figure 9A:
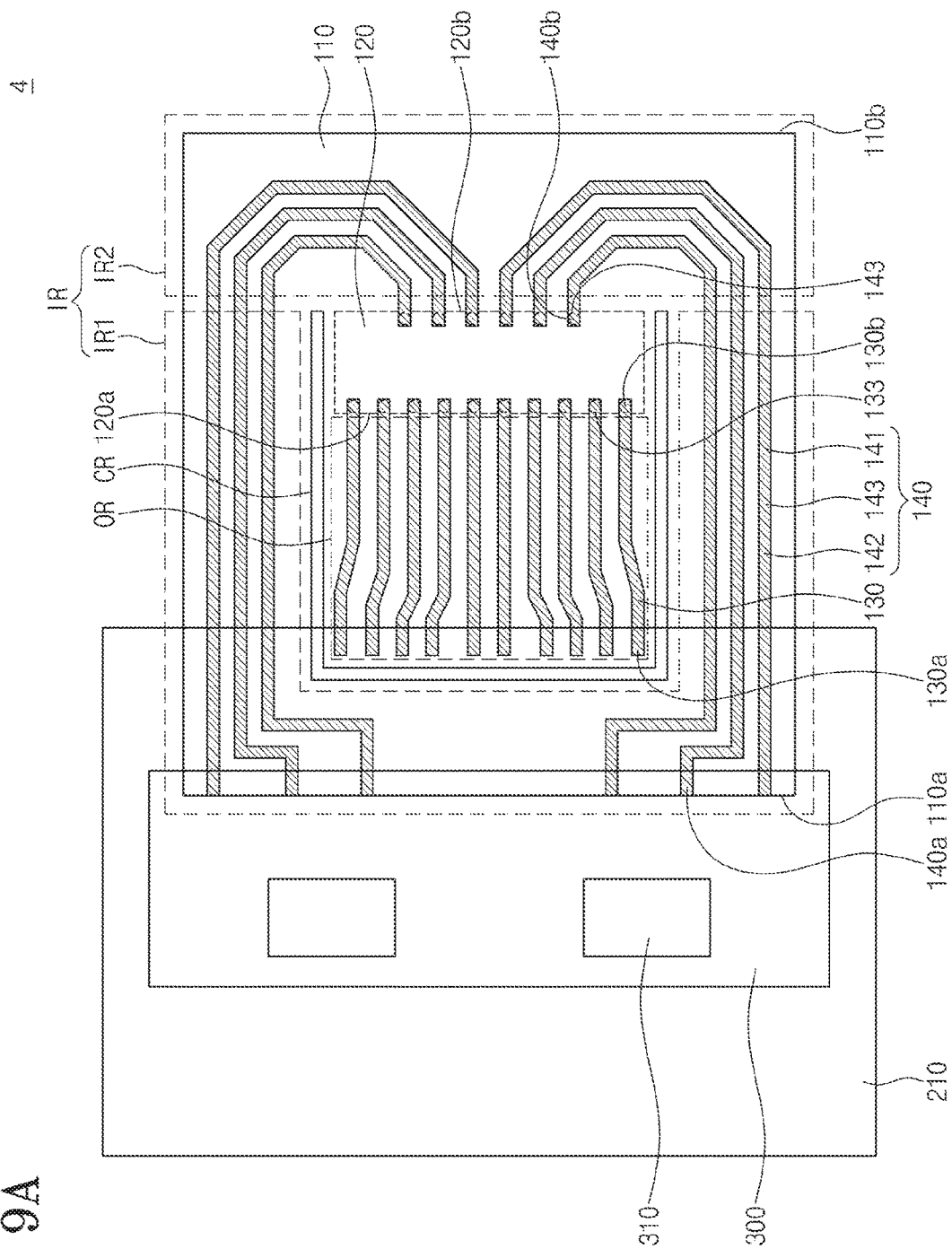
FIG. 9A is a plan view illustrating a package module according to an embodiment of the inventive concepts.
Figure 9B:
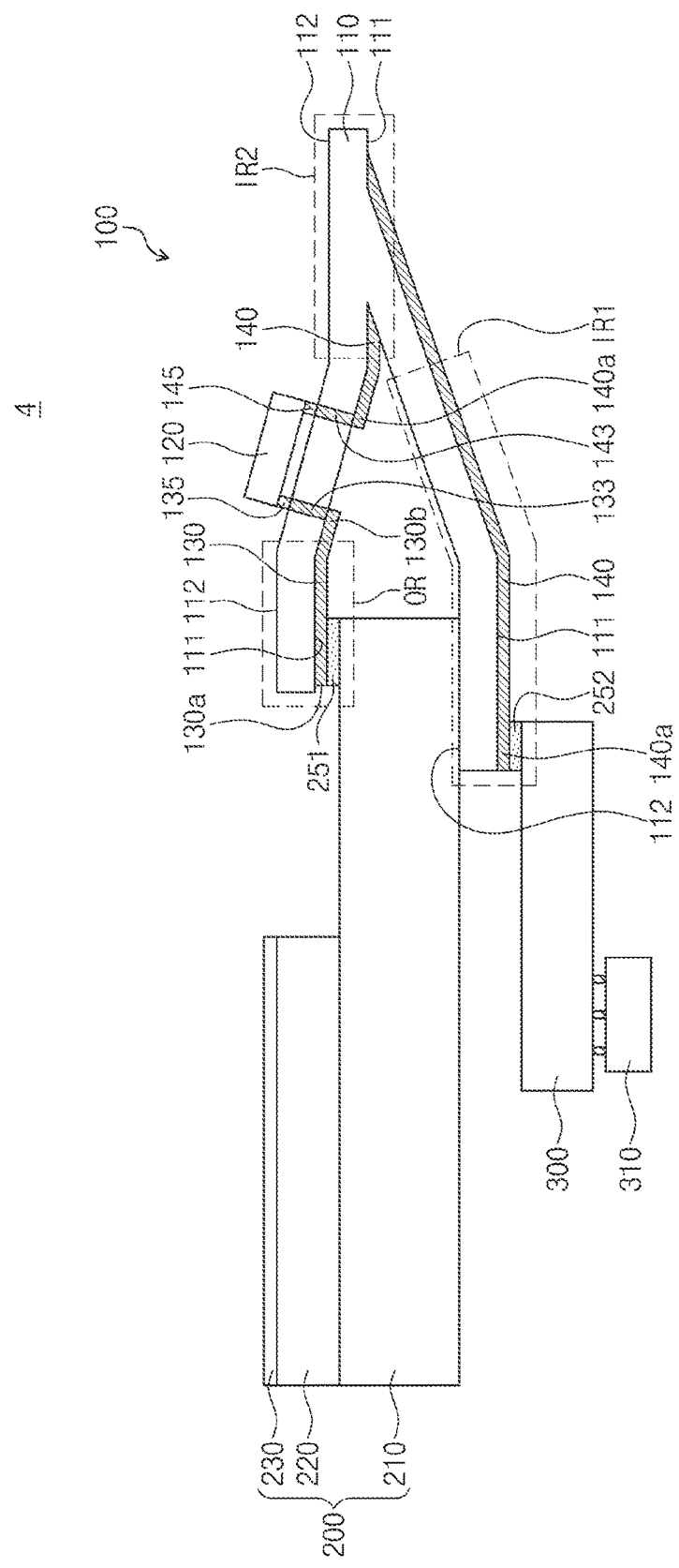
FIG. 9B is a side view of the package module of FIG. 9A.

FIG. 9A is a plan view illustrating a package module including the semiconductor package of FIGS. 8A and 8B according to an embodiment of the inventive concepts. FIG. 9B is a side view of the package module of FIG. 9A. To avoid redundancy in the description, elements already described and with like reference numbers may not again be described in connection with FIGS. 9A and 9B.

The package module 4 of FIGS. 9A and 9B is essentially the same as package module 1 of FIGS. 3A through 3D described above, except that the semiconductor package 100 is configured as in FIGS. 8A and 8B, and the semiconductor chip 120 is located on the second surface 112 of the film substrate 110 so as to face upwardly in the cross-sectional view of FIG. 9B.

Figure 10A:
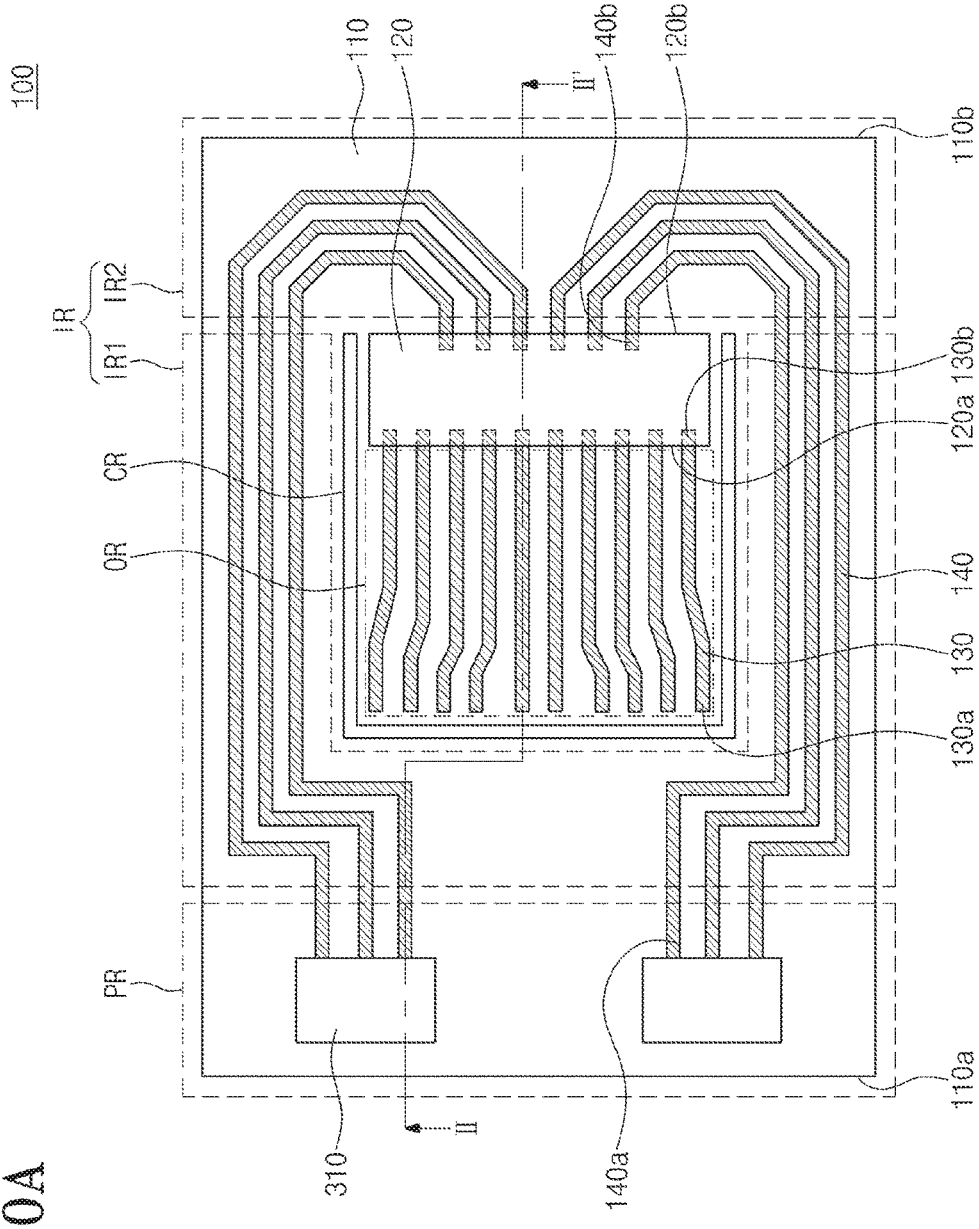
FIG. 10A is a plan view illustrating a semiconductor package according to an embodiment of the inventive concepts.
Figure 10B:
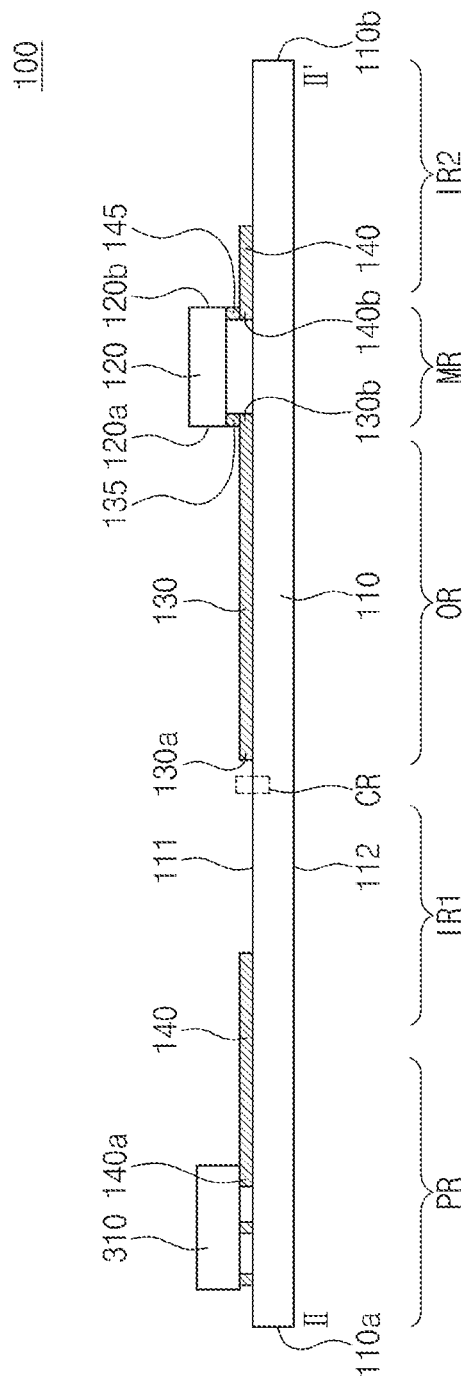
FIG. 10B is a cross-sectional view taken along a line II-II' of FIG. 10A.

FIG. 10A is a plan view illustrating a semiconductor package according to an embodiment of the inventive concepts. FIG. 10B is a cross-sectional view taken along a line II-II' of FIG. 10A. To avoid redundancy in the description, elements already described and with like reference numbers may not again be described in connection with FIGS. 10A and 10B.

The semiconductor package of FIGS. 10A and 10B is essentially the same as that of FIGS. 2A and 2B, except that the film substrate further includes a circuit region PR located between the first sidewall 110a and the first input region IR1. Also, mounted on the first surface 111 of the circuit region PR are one or more passive devices 310 such as those described previously in connection with FIGS. 3A through 3D. In the example of this embodiment, the body of the film substrate 110 is of a constant thickness and encompasses the circuit region PR as well as output and input regions OR and IR. Circuit patterns (not shown) may be provided in the circuit region PR of the film substrate 110. Also, in the present embodiment, the input interconnection lines 140 extend on the first surface 111 into the circuit region PR for electrical connection at their distal ends 140a to the passive devices 310.

Figure 11A:
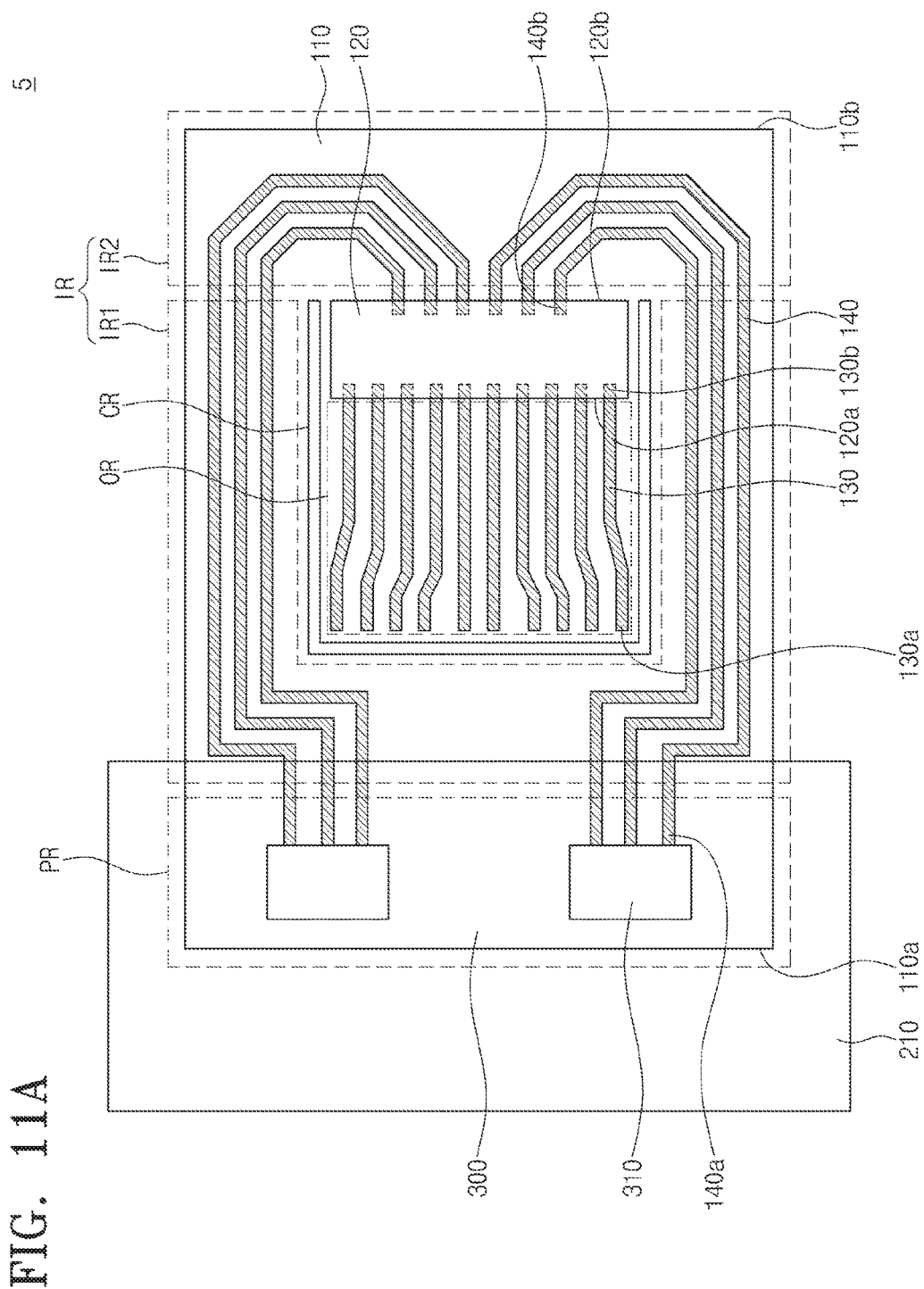
FIG. 11A is a plan view illustrating a package module according to an embodiment of the inventive concepts.
Figure 11B:
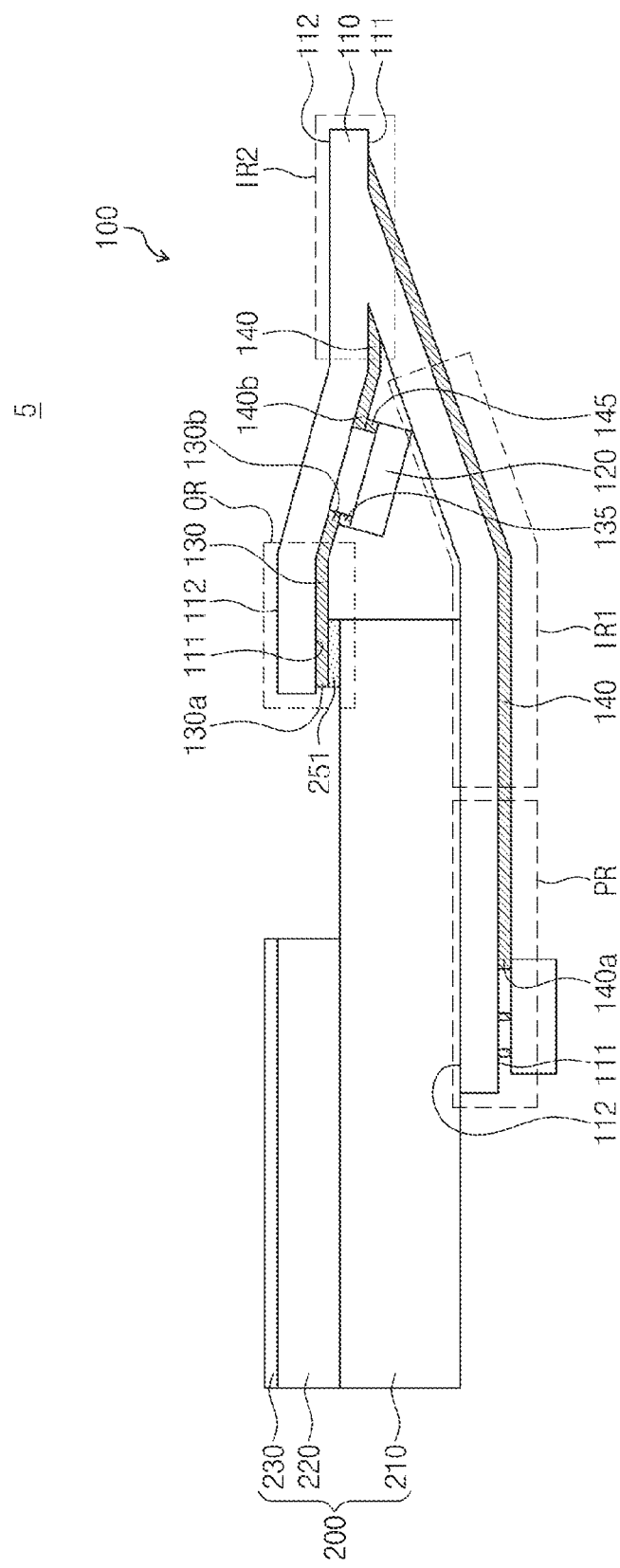
FIG. 11B is a side view of the package module of FIG. 11A.

FIG. 11A is a plan view illustrating a package module including the semiconductor package 100 of FIGS. 10A and 10B according to an embodiment of the inventive concepts. FIG. 11B is a side view of the package module of FIG. 11A. To avoid redundancy in the description, elements already described and with like reference numbers may not again be described in connection with FIGS. 5A and 5B.

The package module 5 of FIGS. 11A and 11B is essentially the same as package module 1 of FIGS. 3A through 3D described above, except that the circuit substrate 300 of the package module 1 is replaced by the circuit region PR of the film substrate 110 of the semiconductor package 100 of FIGS. 10A and 10B. As such, the connection film 252 for connection to the circuit substrate 300 is omitted in the present embodiment.

By configuring the film substrate 110 to include the circuit region PR, the provision of the circuit substrate 300 may be avoided to simplify the fabrication process. Also, as is apparent by comparing the cross-sectional views of FIGS. 3C and 11B, the vertical profile of the package module 5 is advantageously less than that of the package module 1.

Figure 12A:
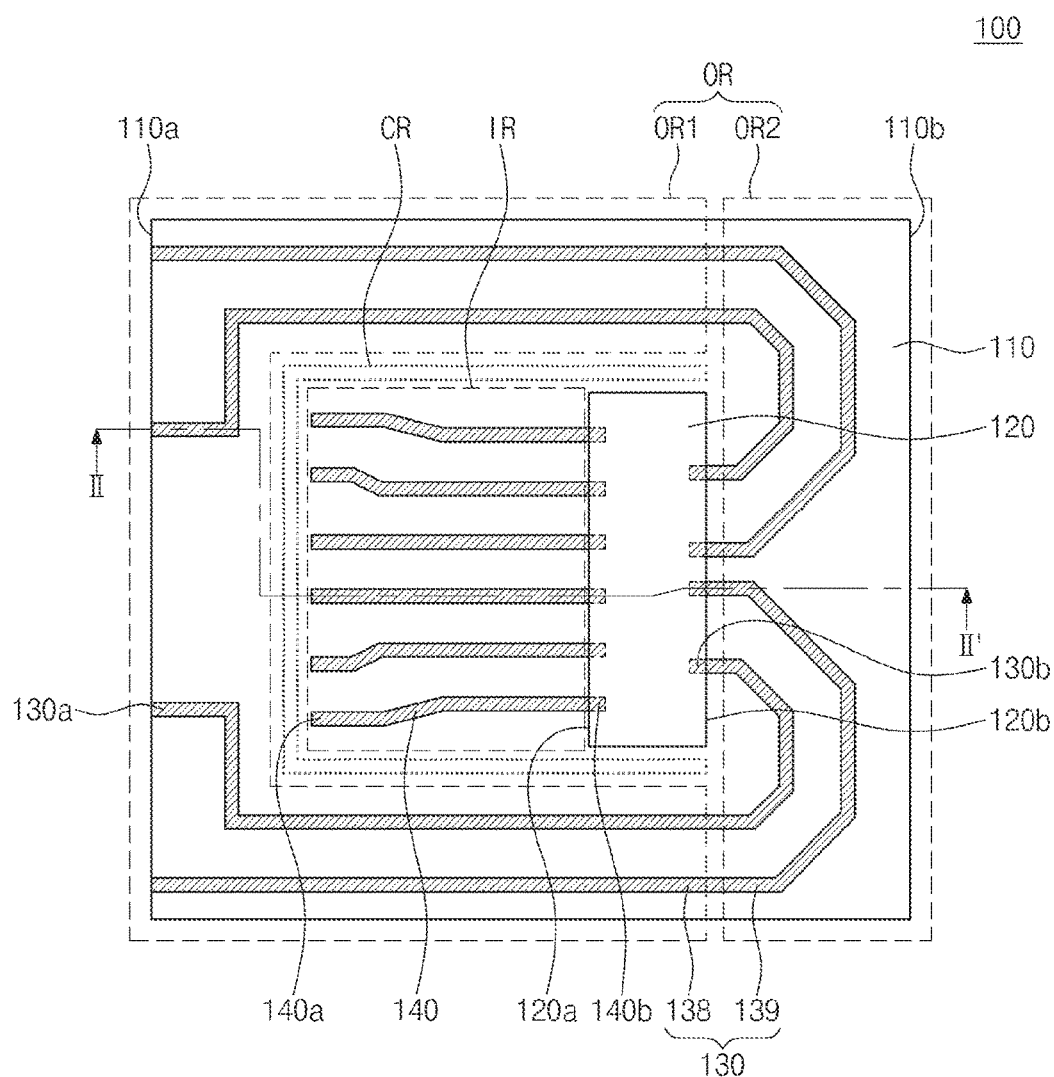
FIG. 12A is a plan view illustrating a semiconductor package according to an embodiment of the inventive concepts.
Figure 12B:
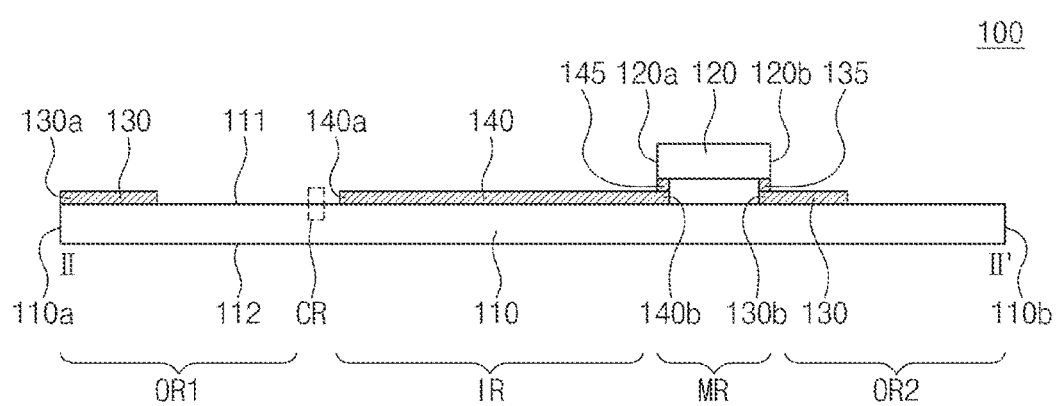
FIG. 12B is a cross-sectional view taken along a line II-II' of FIG. 12A.

FIG. 12A is a plan view illustrating a semiconductor package according to an embodiment of the inventive concepts. FIG. 12B is a cross-sectional view taken along a line II-II' of FIG. 12A. To avoid redundancy in the description, elements already described and with like reference numbers may not again be described in connection with FIGS. 12A and 12B.

The embodiment of FIGS. 12A and 12B is essentially the same as that of FIGS. 2A and 2B, except that the input region IR of the embodiment of FIGS. 12A and 12B is located in a central area or core of the film substrate 110 when viewed from a plan view (as in FIG. 12A), and the output region OR of the embodiment of FIGS. 12A and 12B is located in a peripheral area of the film substrate 110 when viewed from a plan view. Therefore, in the embodiment of FIGS. 12A and 12B, the input interconnection lines 140 are located in the central area or core of the film substrate 110, and the output interconnection lines 140 are located in the peripheral area of the film substrate 110. As a consequence, the input and output terminals 145 and 135 are located at opposite sides of the lower surface of the semiconductor chip relative to those shown in FIGS. 2A and 2B. The embodiment of FIGS. 12A and 12B also differs from that of FIGS. 2A and 2B in that it has fewer input and output interconnection lines 140 and 130.

Figure 13A:
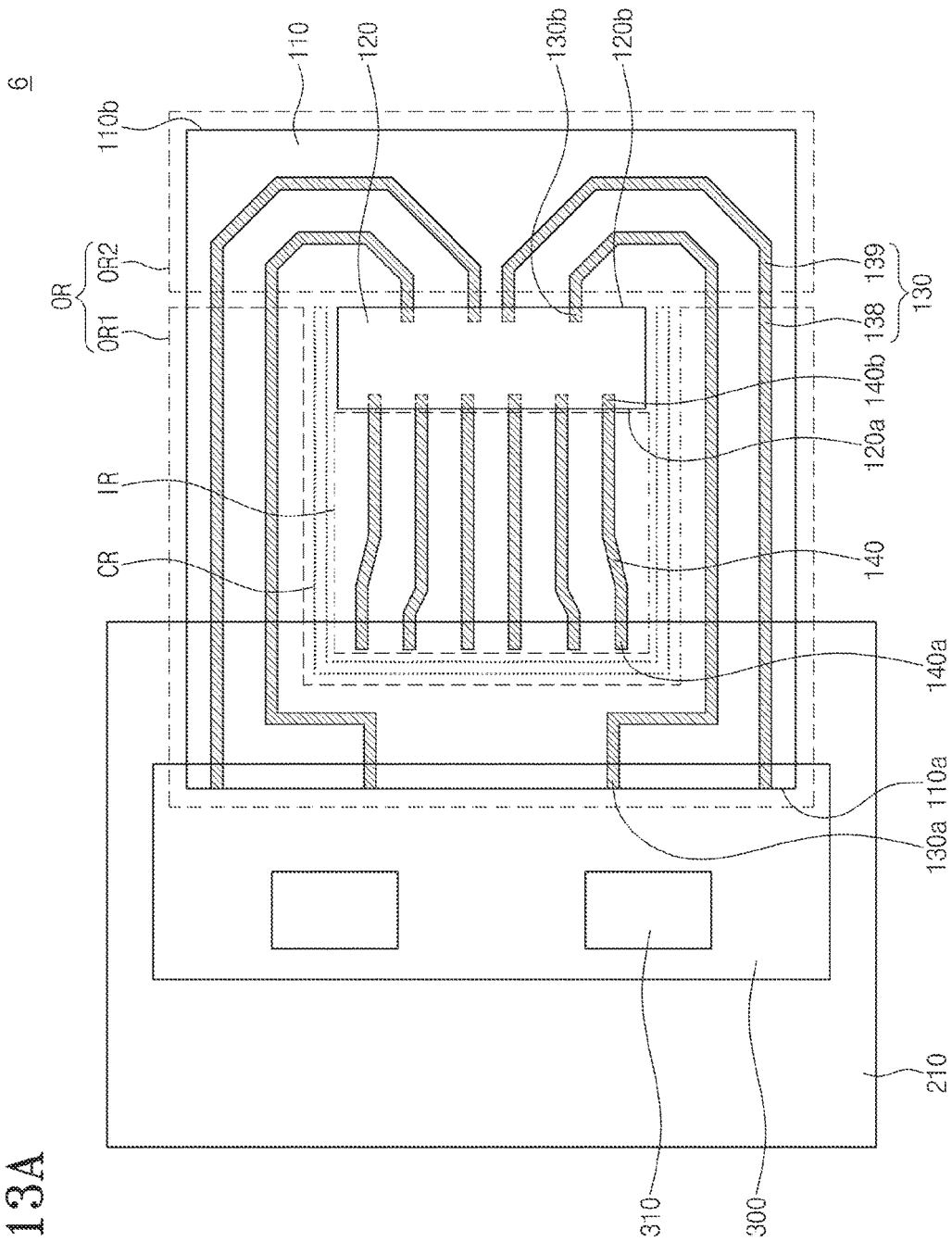
FIG. 13A is a plan view illustrating a package module according to an embodiment of the inventive concepts.
Figure 13B:
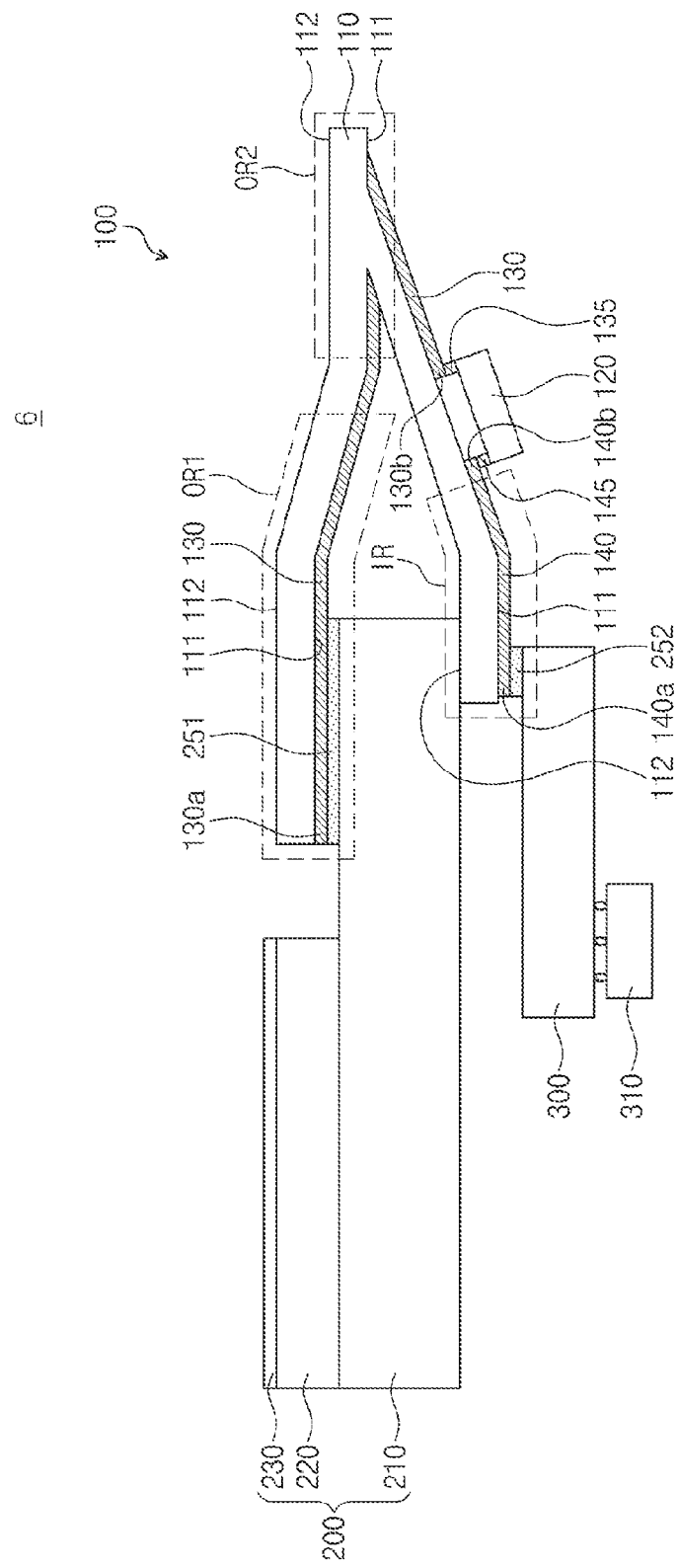
FIG. 13B is a side view of the package module of FIG. 13A.

FIG. 13A is a plan view illustrating a package module including the semiconductor package 100 of FIGS. 12A and 12B according to an embodiment of the inventive concepts. FIG. 13B is a side view of the package module of FIG. 13A. To avoid redundancy in the description, elements already described and with like reference numbers may not again be described in connection with FIGS. 13A and 13B.

The package module 6 of FIGS. 13A and 13B is essentially the same as the package module 1 of FIGS. 3A through 3D, expect that output interconnection lines 130 connected to the panel substrate 210 are longer and located along the peripheral output region OR1, whereas the input interconnection lines 140 are shorter and located in the centrally position input region IR. As such, the semiconductor chip 120 of the package module 6 is positioned lower in cross-sectional view of FIG. 13B.

In some embodiments, the display panel 220 may be driven by a relatively small number of the output interconnection lines 130. For example, the package module 6 may be a display device assembly used as a wearable module. In this case, the total number of the output interconnection lines 130 may be smaller than the total number of the input interconnection lines 140. Thus, as with the embodiments of FIGS. 12A, 12B, 13A and 13B, the output interconnection lines 130 may be disposed on the edge region of the film substrate 110, and the input interconnection lines 140 may be disposed on the core of the film substrate 110.

It is noted here that embodiments described above represent non-limiting examples of the inventive concepts. Further, features of the embodiments may be combined in a variety of different ways. As one example only, the embodiment of FIGS. 10A and 10B can be modified such that the semiconductor chip 120 is located on the second surface 112 of the film substrate 120 as in the embodiment of FIGS. 8A and 8B.

Figure 14:
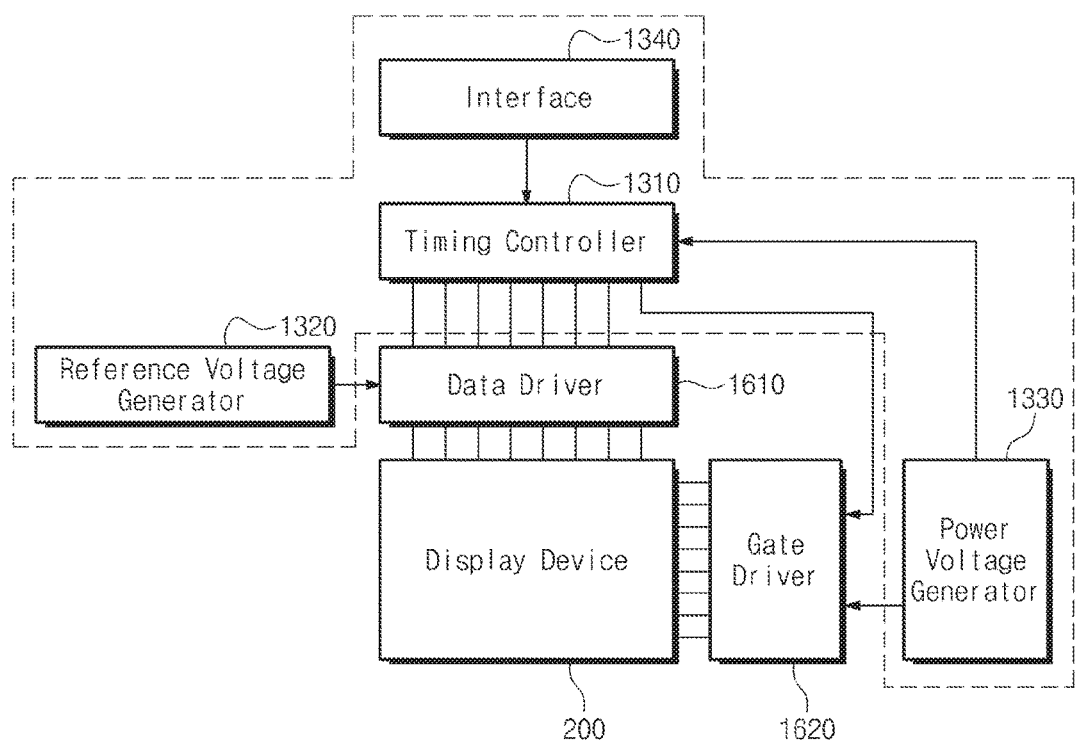
FIG. 14 is a schematic block diagram for reference in describing an operation of a package module according to embodiments of the inventive concepts.

FIG. 14 is a schematic operational block diagram of the package module 1 through 6 according an embodiment of the inventive concepts. For purposes of description, the package module 6 of FIGS. 13A and 13B will be referenced in the description of FIG. 14.

The display device 200 of the package module 6 of FIGS. 13A and 13B may constitute the display device 200 of FIG. 14.

The semiconductor chip 130 of the package module 6 of FIGS. 13A and 13B may constitute a data driver 1610 and a gate driver 1620 of FIG. 14. The data driver 1610 functions to process data signals transmitted from a timing controller 1310, while the gate driver 1620 functions to process scan signals transmitted from the timing controller 1310.

The components within the dashed line of FIG. 14, namely, the timing controller 1310, a reference voltage generator 1320, a power voltage generator 1330, and an interface unit 1340, may generally correspond to the passive device 310 and be mounted on the circuit substrate 300 of the package module 6 of FIGS. 13A and 13B. The timing controller 1310 functions to generate control signals as well as the previously mentioned data signals and the scan signals. The reference voltage generator 1320 functions to generate a reference voltage which is used to generate color signals or image signals corresponding to the data signals in the data driver 1610. In operation, the data signals (corresponding to signals received via the interface 1340) may be temporarily stored or latched in the data driver 1610 in accordance with the control signals. Thereafter, the color signals or the image signals may be synchronized with the scan signals transmitted from the gate driver 1620 so as to be transmitted to data lines of the display device 200. In the meantime, the gate driver 1620 sequentially transmits the scan signals to gate lines of the display device 200. The power voltage generator 1330 may generate a power voltage, which may be different than a reference voltage, for the timing controller 1310 and the gate driver 1620.

FIGS. 15A, 15B, 15C, and 15D illustrate a few non-limiting examples of multimedia devices that may be implemented with or incorporate package modules according to embodiments of the inventive concepts.

Figure 15A:
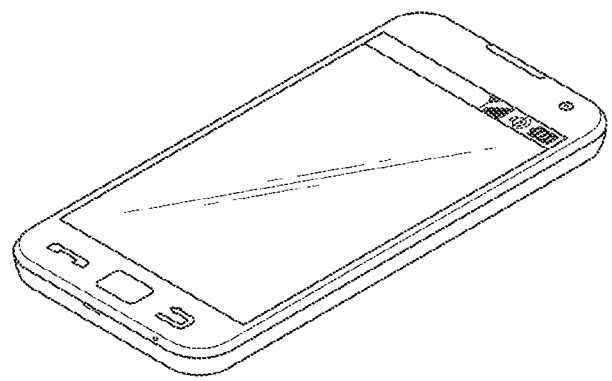
FIGS. 15A, 15B, 15C, and 15D illustrate embodiments of multimedia devices implemented with package modules according to embodiments of the inventive concepts.
Figure 15B:
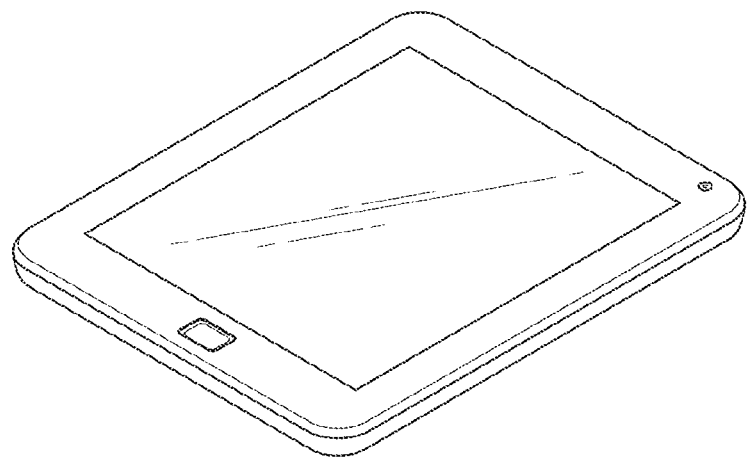
Figure 15C:
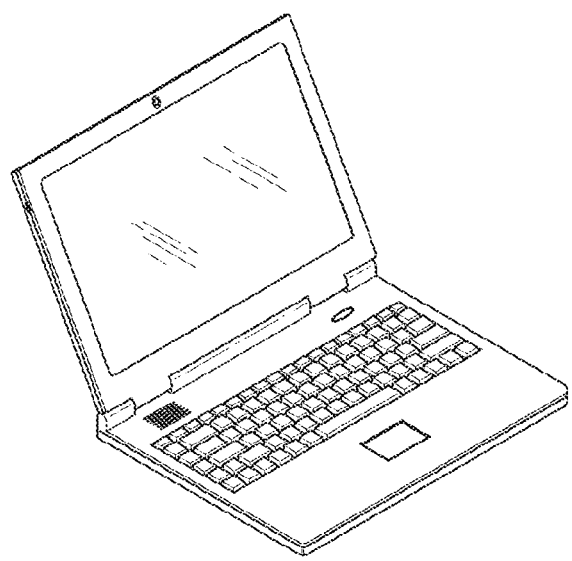
Figure 15D:
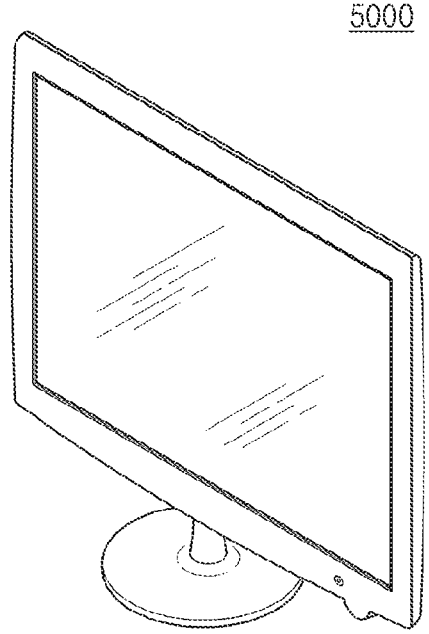

At least one of the package modules according to the above described embodiments of the inventive concepts may be applied to a mobile or smart phone 2000 such as that illustrated in FIG. 15A and/or a tablet or smart tablet 3000 such as that illustrated in FIG. 15B. In addition, at least one of the package modules according to the above described embodiments of the inventive concepts may be applied to a notebook computer 4000 such as that illustrated in FIG. 15C and/or a television, monitor or smart television 5000 such as that illustrated in FIG. 15D.

According to embodiments of the inventive concepts, the film substrate may have the cutting region, so the output region of the film substrate may be vertically spaced apart from the input region of the film substrate. In the package module, the first surface of the output region and the second surface of the input region may face each other when viewed from a side view. The panel substrate may be disposed between the first surface of the output region and the second surface of the input region. The film substrate of the package module may have a relatively small curvature or may not have a curvature, so the damage of the input and/or output interconnections may be minimized or prevented in the package module.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
    a flexible film substrate having an inner region and an outer region, a chip mounting region between the inner region and the outer region, and a cut-line partially surrounding the inner region;
    a semiconductor chip disposed on the chip mounting region and mounted to the flexible film substrate;
    first interconnection lines electrically connected to the semiconductor chip, and extending along the inner region of the flexible film substrate from a first side of the chip mounting region of the flexible film substrate to a boundary of the inner region of the flexible film substrate, whereby the first interconnection lines have distal ends located along the boundary of the inner region; and
    second interconnection lines electrically connected to the semiconductor chip, and extending along the outer region of the flexible film substrate from a second side of the chip mounting region of the flexible film substrate to a boundary of the outer region of the flexible film substrate, whereby the second interconnection lines have distal ends located along the boundary of the outer region, and
    wherein the boundary of the inner region and the boundary of the outer region are each located on the first side of the chip mounting region,
    the cut-line of the flexible film substrate extends vertically through the flexible film substrate, and
    the cut-line is interposed between respective parts of the inner region of the flexible film substrate and the outer region of the flexible film substrate such that the inner region is separated from the outer region along the cut-line.

2. The semiconductor package of claim 1, wherein the first side of the chip mounting region is located directly adjacent the inner region of the flexible film substrate.

3. The semiconductor package of claim 1, wherein the inner region has four sides and the cut-line extends through the flexible film substrate along only three of the four sides of the inner region.

4. The semiconductor package of claim 3, wherein an intermediate of the three sides of the inner region defines the boundary of the inner region to which the first interconnection lines extend and is spaced from and parallel to the boundary of the outer region to which the second interconnection lines extend.

5. The semiconductor package of claim 1, wherein the second interconnection lines wrap around opposite ends of the chip mounting region and extend from locations adjacent the opposite ends to the boundary of the outer region.

6. The semiconductor package of claim 1, wherein the flexible film substrate is configurable between a first orientation in which the inner region is coplanar with the outer region in a side view, and a second orientation in which the inner region extends at an angle from the outer region in the side view.

7. The semiconductor package of claim 1, wherein the semiconductor chip is a display driver.

8. The semiconductor package of claim 1, wherein the first interconnection lines are output lines from the semiconductor chip, and the second interconnection lines are input lines to the semiconductor chip.

9. The semiconductor package of claim 1, wherein the flexible film substrate has opposite surfaces, and the semiconductor chip is disposed on one of the opposite surfaces of the flexible film substrate, and the first and second interconnection lines are disposed on said one of the opposite surfaces of the flexible film substrate.

10. The semiconductor package of claim 1, wherein the flexible film substrate has opposite surfaces, and the semiconductor chip is disposed on one of the opposite surfaces of the flexible film substrate and the first and second interconnection lines are disposed on the other of the opposite surfaces of the flexible film substrate.

11. The semiconductor package of claim 1, wherein the flexible film substrate has opposite surfaces, the first interconnection lines and/or the second interconnection lines each include a first portion on one of the opposite surfaces of the flexible film substrate, a second portion on the other of the opposite surfaces of the flexible film substrate, and a substrate via connecting the first and second portions.

12. The semiconductor package of claim 1, wherein the flexible film substrate has a circuit region adjacent the boundary of the outer region of the flexible film substrate, and the second interconnection lines extend into the circuit region.

13. The semiconductor package of claim 12, further comprising a passive device mounted to the flexible film substrate and disposed on the circuit region of the flexible film substrate.

14. The semiconductor package of claim 13, wherein the flexible film substrate has opposite surfaces, the passive device is disposed on a one of the opposite surfaces of the flexible film substrate, and the semiconductor chip is disposed on said one of the opposite surfaces of the flexible film substrate.

15. The semiconductor package of claim 1, wherein the cut-line loops around the first interconnection lines and terminates at locations adjacent opposite ends of the chip mounting region, respectively, and the cut-line delimits a tab that includes the inner region and the chip mounting region of the flexible film substrate combined, the tab being surrounded by the outer region of the flexible film substrate.

16. A chip-on-film (COF) package, comprising:
a flexible film substrate including a first surface and an opposite second surface, and the flexible film substrate having a chip mounting region and a cut line penetrating through the flexible film substrate from the first surface to the second surface, wherein the cut line separates a first part of the flexible film substrate that contains the chip mounting region from a second part of the flexible film substrate in a vertical direction, in a side view;
a semiconductor chip mounted to the flexible film substrate and disposed on the chip mounting region;
first interconnection lines electrically connected to the semiconductor chip and extending from the chip mounting region and having distal ends, at which the first interconnection lines terminate, on the first part of the flexible film substrate;
second interconnection lines electrically connected to the semiconductor chip and extending from the chip mounting region and having distal ends, at which the second interconnection lines terminate, on the second part of the flexible film substrate, wherein the cut-line loops around the first interconnection lines and terminates at locations adjacent opposite ends of the chip mounting region, respectively, and the cut-line delimits a tab that includes the first part and the chip mounting region of the flexible film substrate combined, the tab being surrounded by the second part of the flexible film substrate.

17. The COF package of claim 16, wherein the semiconductor chip is a display driver.

* * * * *